United States Patent
Fujitsuka et al.

(10) Patent No.: US 7,999,305 B2
(45) Date of Patent: Aug. 16, 2011

(54) SEMICONDUCTOR DEVICE

(75) Inventors: Ryota Fujitsuka, Yokohama (JP);
Yoshio Ozawa, Yokohama (JP);
Katsuaki Natori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/362,019

(22) Filed: Jan. 29, 2009

(65) Prior Publication Data
US 2009/0194808 A1    Aug. 6, 2009

(30) Foreign Application Priority Data
Jan. 31, 2008    (JP) .................................. 2008-020941

(51) Int. Cl.
*H01L 29/792*    (2006.01)

(52) U.S. Cl. ........... 257/324; 257/E21.18; 257/E21.423; 438/287

(58) Field of Classification Search .................. None
See application file for complete search history.

(56) References Cited

U.S. PATENT DOCUMENTS

| 7,223,658 | B2 | 5/2007 | Chen et al. | |
| 2002/0130350 | A1* | 9/2002 | Shin et al. | 257/314 |
| 2002/0149081 | A1* | 10/2002 | Goda et al. | 257/510 |
| 2005/0205923 | A1 | 9/2005 | Han et al. | |
| 2007/0075352 | A1 | 4/2007 | Irie | |
| 2008/0061361 | A1* | 3/2008 | Lee et al. | 257/324 |
| 2008/0290394 | A1* | 11/2008 | Duan et al. | 257/316 |

FOREIGN PATENT DOCUMENTS
JP    2004-158810    6/2004
* cited by examiner

*Primary Examiner* — Matthew Smith
*Assistant Examiner* — Shaka Scarlett
(74) *Attorney, Agent, or Firm* — Finnegan, Henderson, Farabow, Garrett & Dunner, L.L.P.

(57) ABSTRACT

A semiconductor device includes an element region having a channel region, and a unit gate structure inducing a channel in the channel region, the unit gate structure including a tunnel insulating film formed on the element region, a charge storage insulating film formed on the tunnel insulating film, a block insulating film formed on the charge storage insulating film, and a control gate electrode formed on the block insulating film, wherein a distance between the element region and the control gate electrode is shorter at a center portion of the unit gate structure than at both ends thereof, as viewed in a section parallel to a channel width direction.

9 Claims, 27 Drawing Sheets

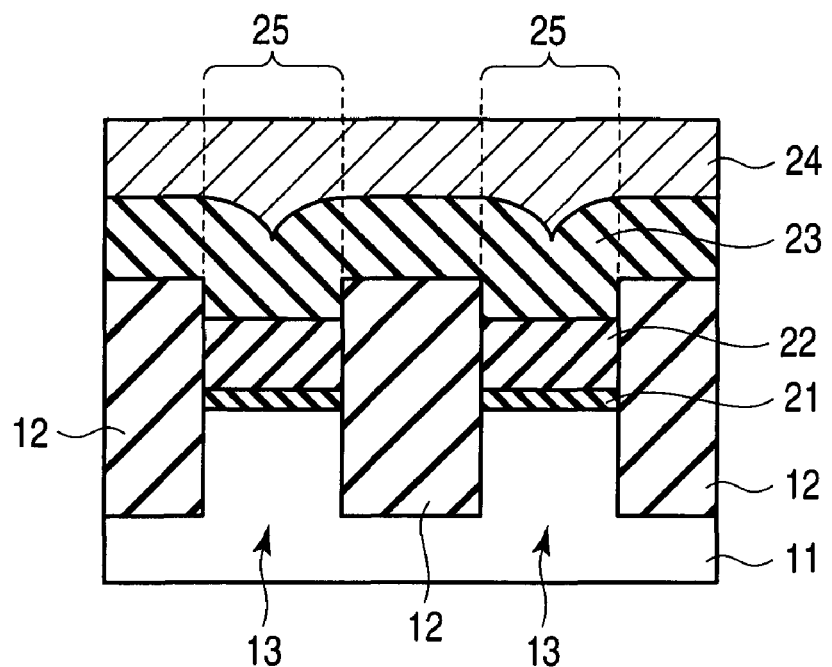
F I G. 1 A
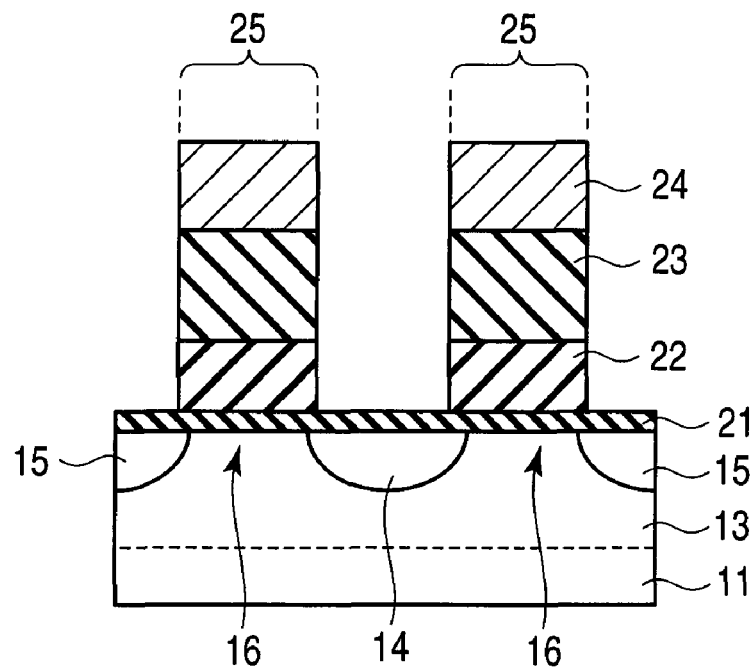
F I G. 1 B

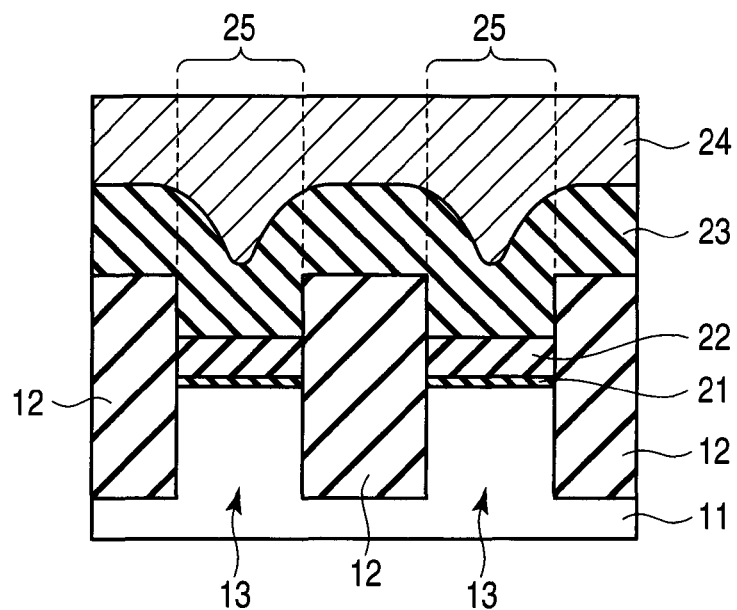
F I G. 7
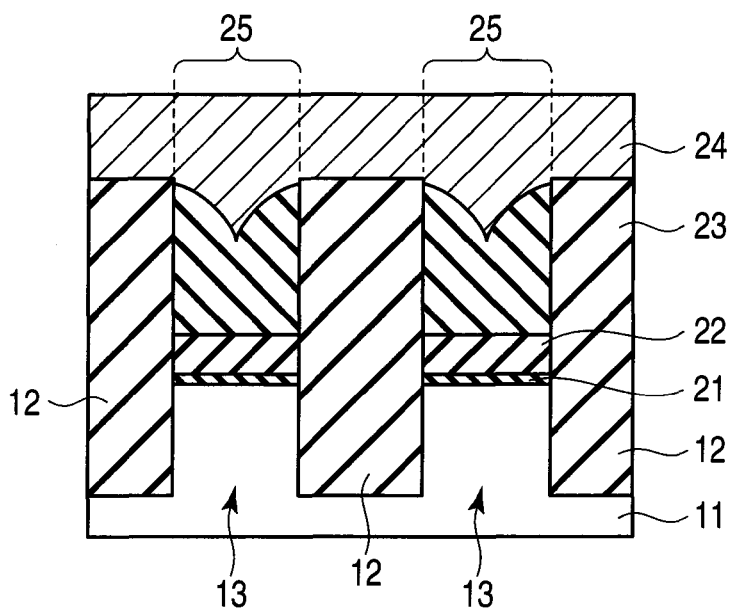
F I G. 8

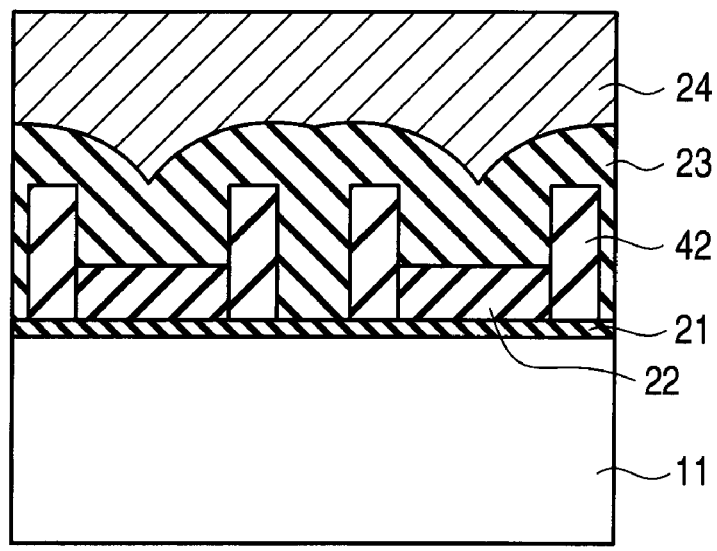
F I G. 15
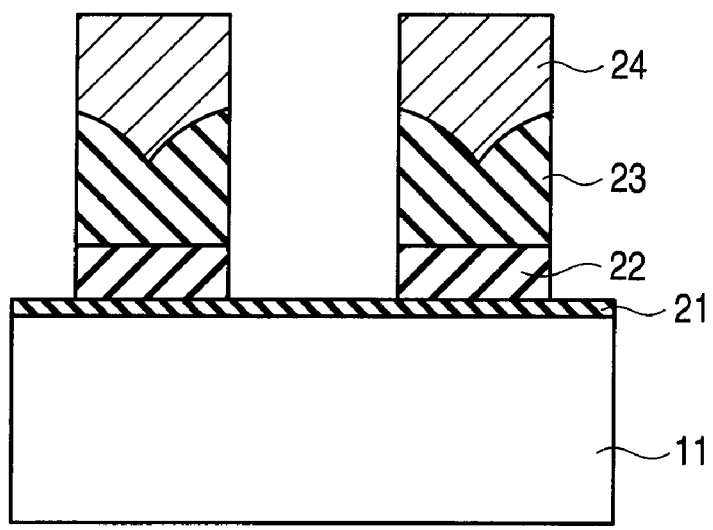
F I G. 16

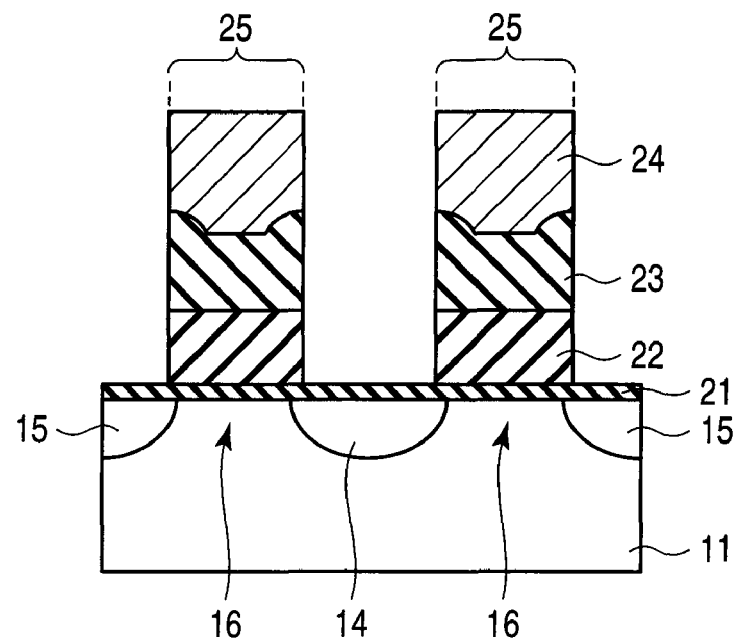
F I G. 1 7
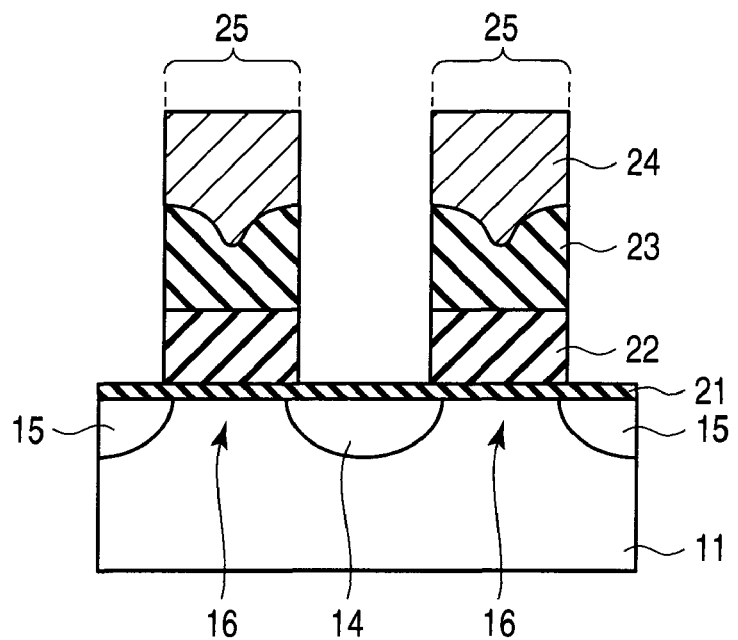
F I G. 1 8

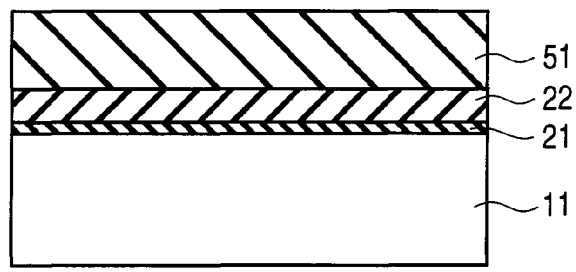 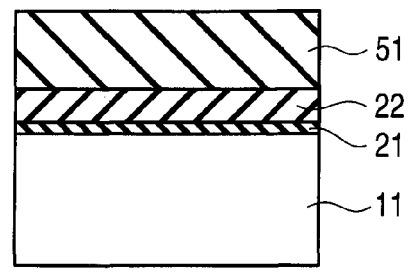
FIG. 20A         FIG. 20B
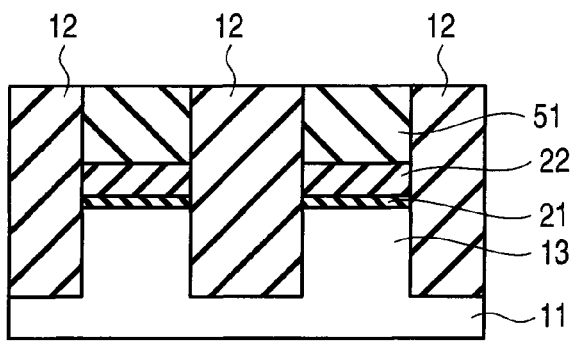 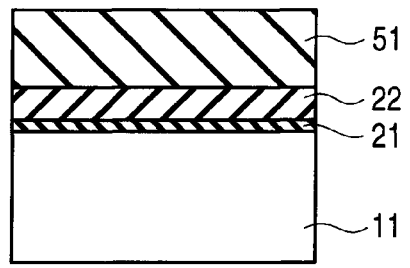
FIG. 21A         FIG. 21B
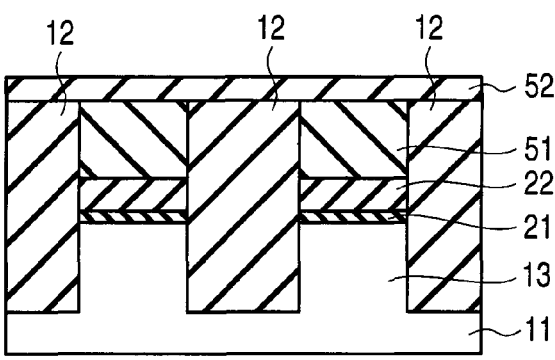 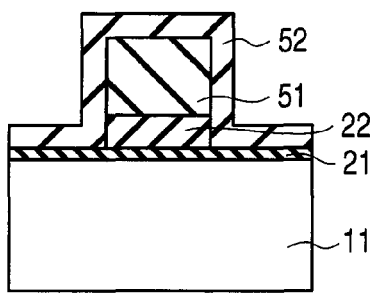
FIG. 22A         FIG. 22B

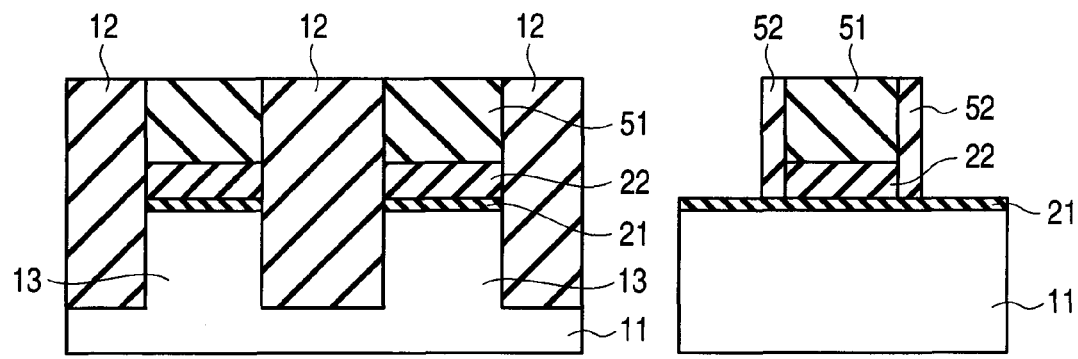
F I G. 2 3 A   F I G. 2 3 B
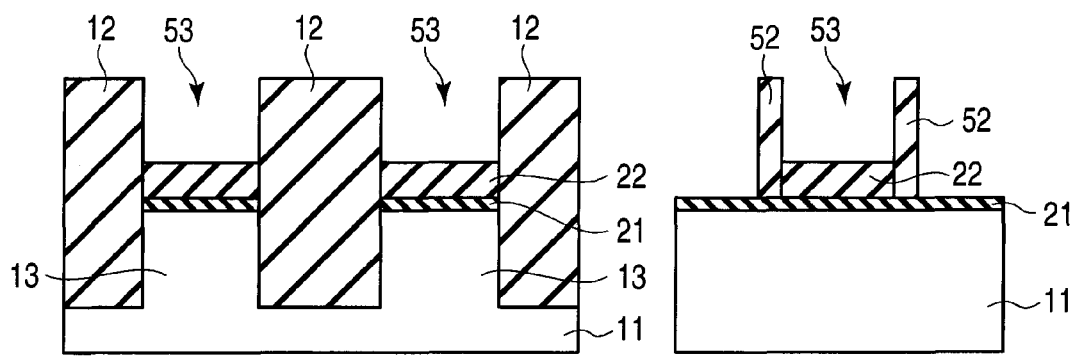
F I G. 2 4 A   F I G. 2 4 B

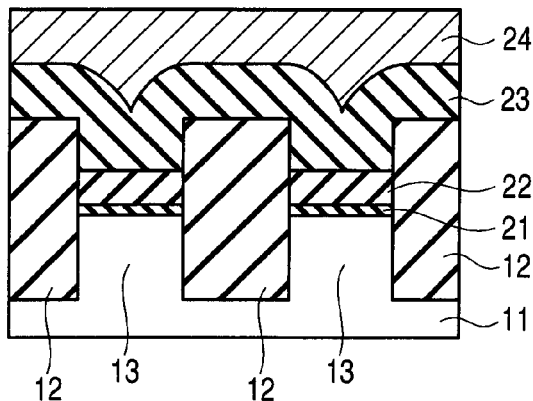
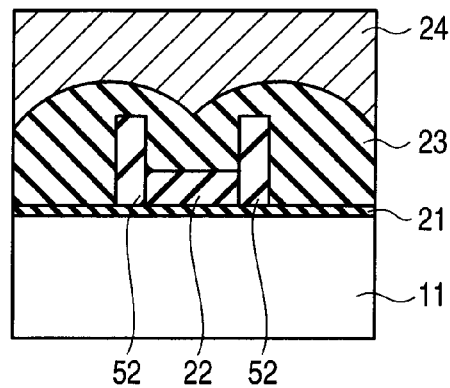
FIG.25A    FIG.25B
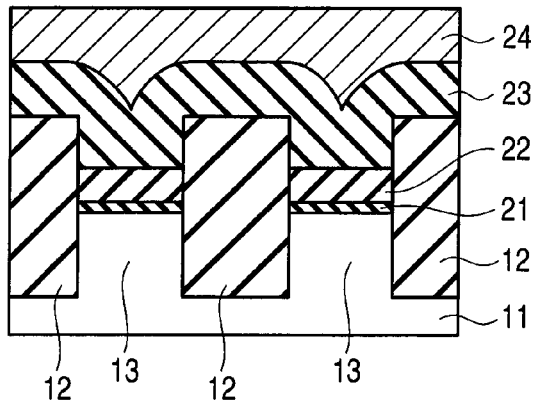
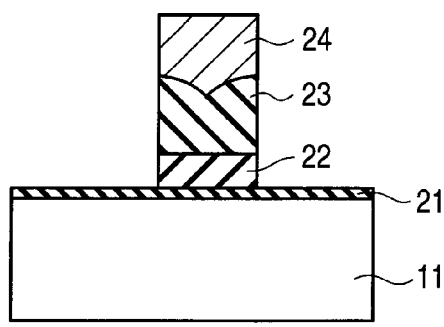
FIG.26A    FIG.26B

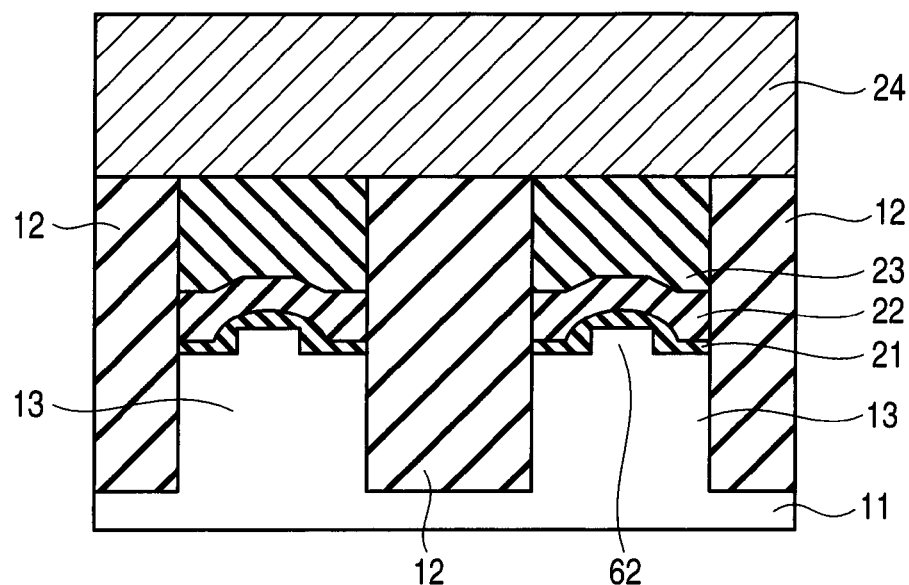
F I G. 3 1
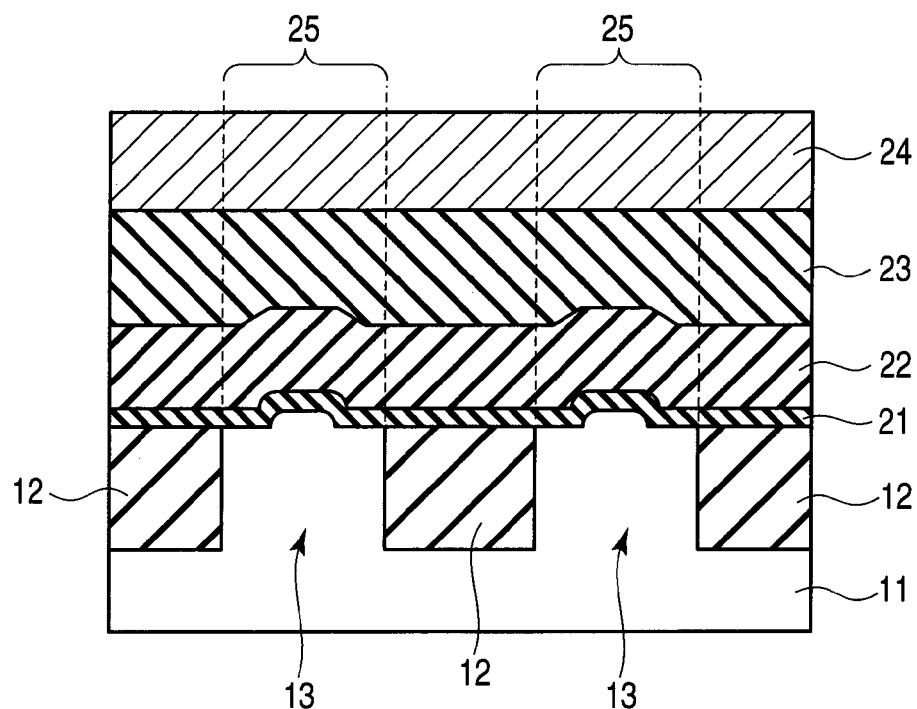
F I G. 3 2

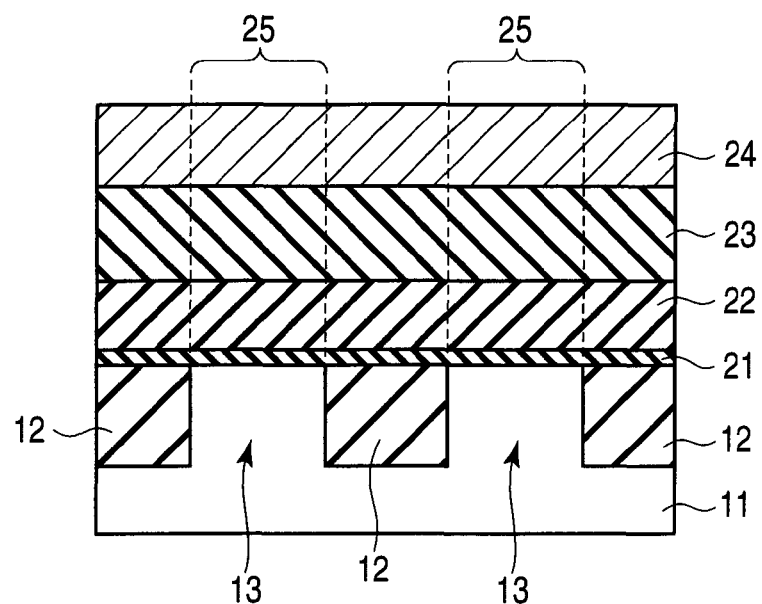
F I G. 3 3 A
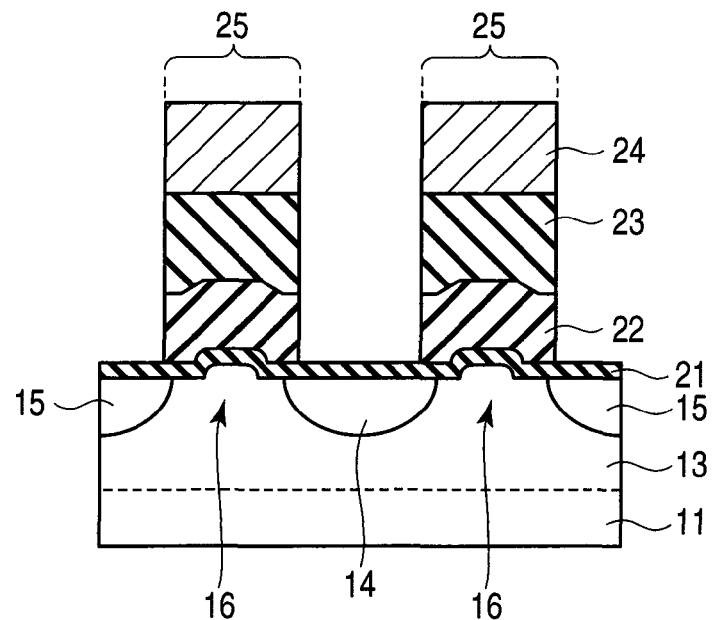
F I G. 3 3 B

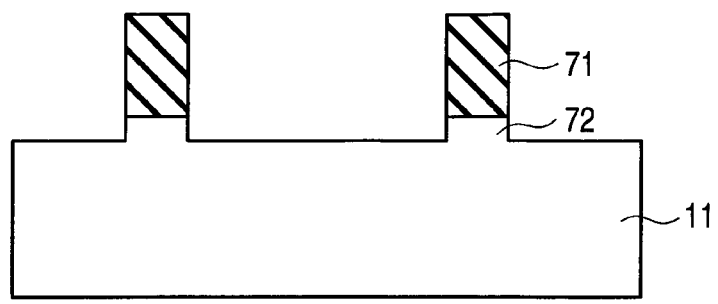
F I G. 34
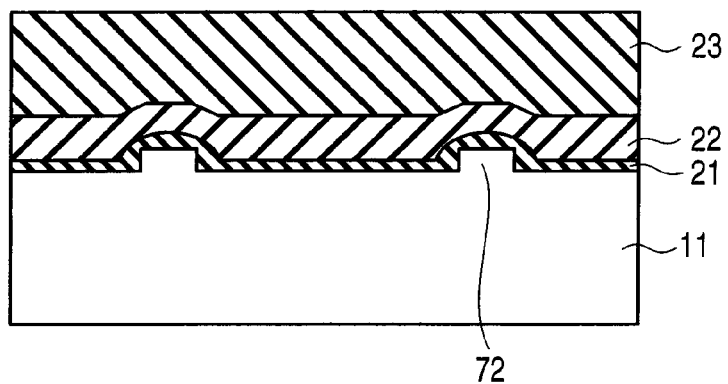
F I G. 35
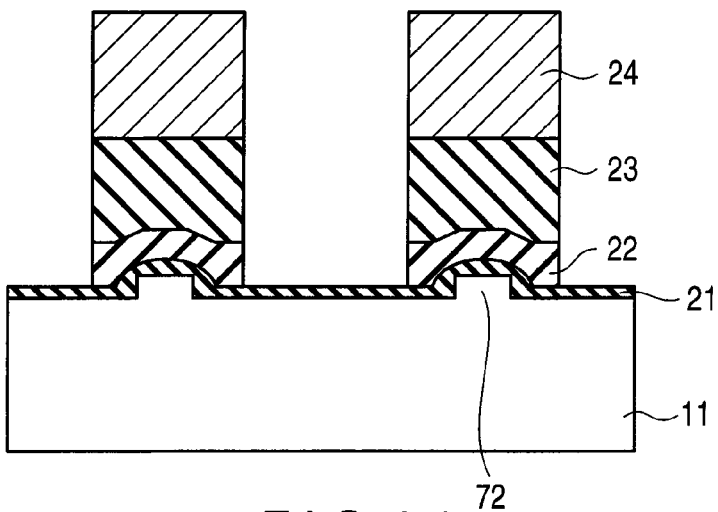
F I G. 36

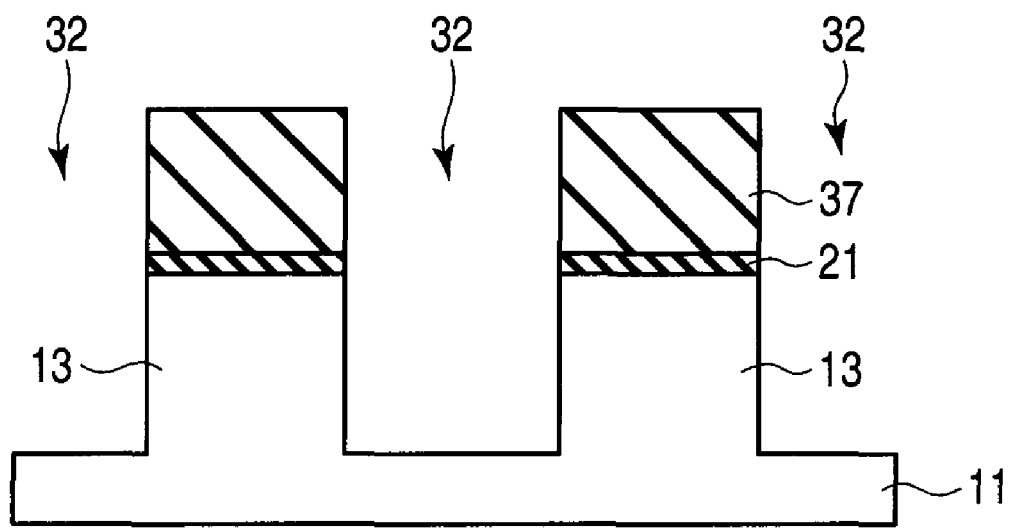
F I G. 3 9
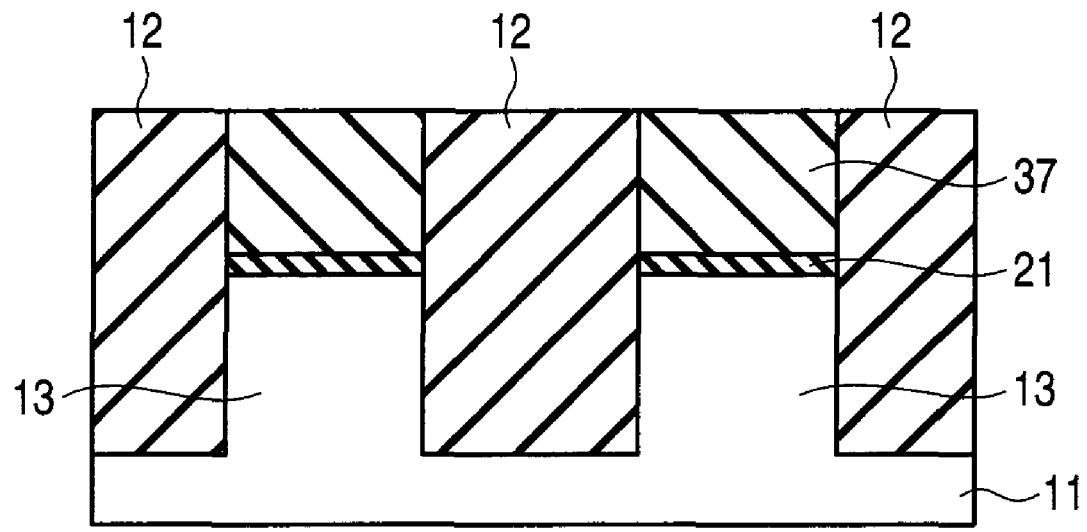
F I G. 4 0

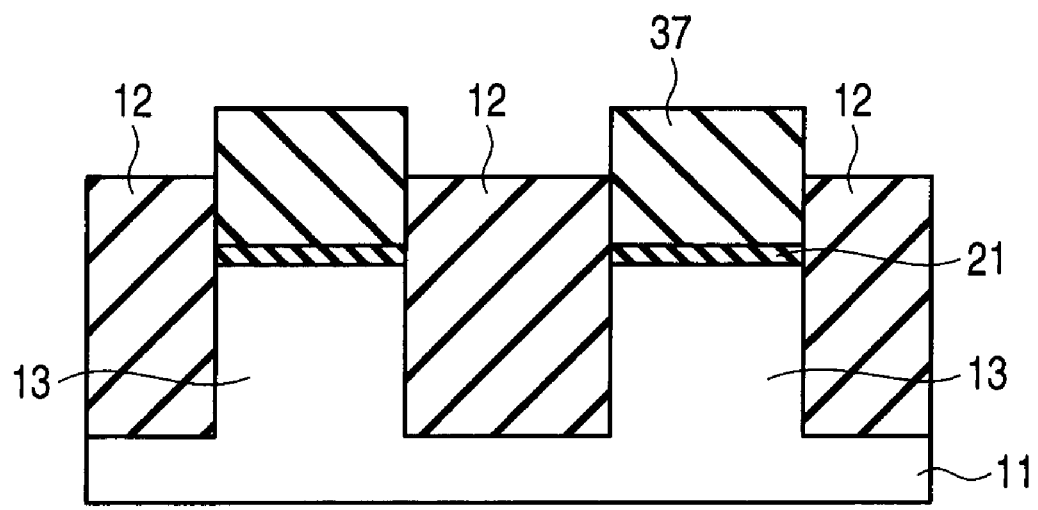
F I G. 4 1
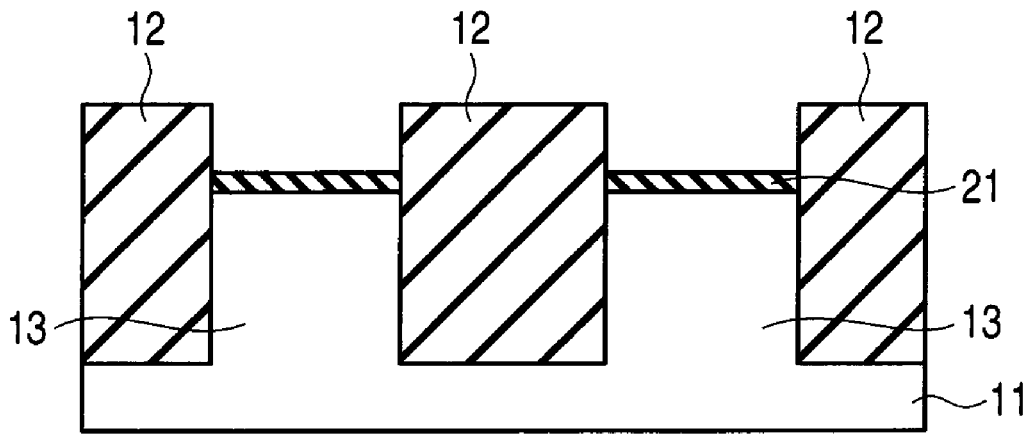
F I G. 4 2

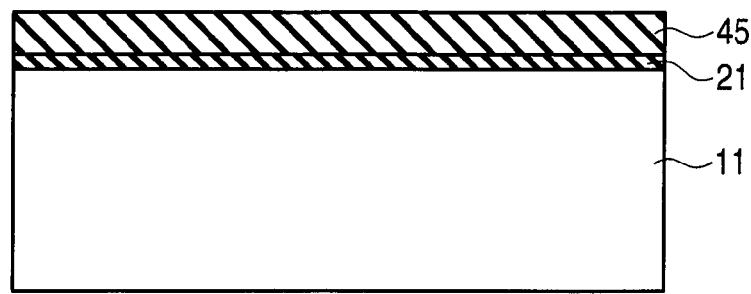
F I G. 4 7
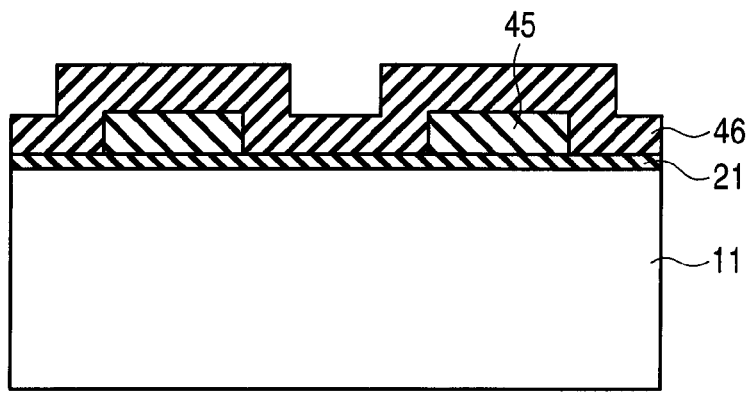
F I G. 4 8
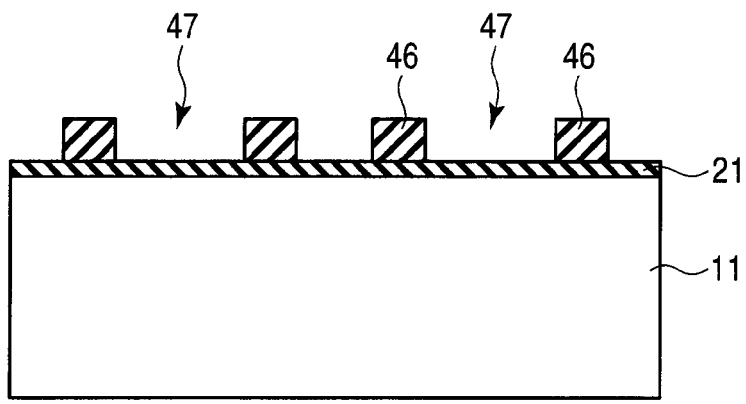
F I G. 4 9

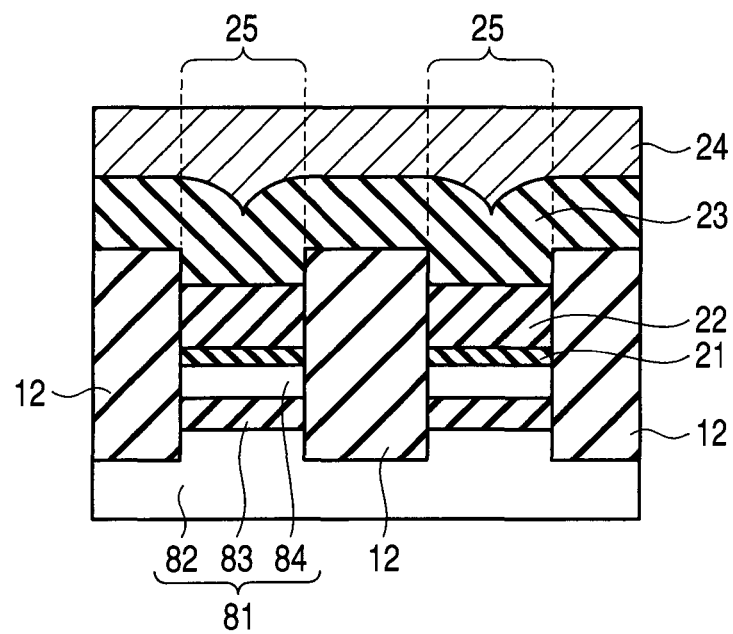
F I G. 5 2 A
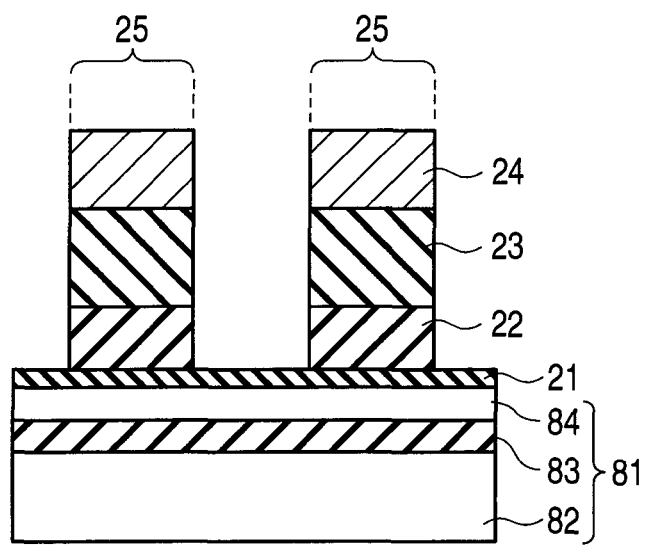
F I G. 5 2 B

SEMICONDUCTOR DEVICE

CROSS-REFERENCE TO RELATED APPLICATIONS

This application is based upon and claims the benefit of priority from prior Japanese Patent Application No. 2008-020941, filed Jan. 31, 2008, the entire contents of which are incorporated herein by reference.

BACKGROUND OF THE INVENTION

1. Field of the Invention

The present invention relates to a semiconductor device.

2. Description of the Related Art

A charge trap type nonvolatile semiconductor memory using a charge storage insulating film for charge trap as a charge storage layer has been proposed (e.g., see Jpn. Pat. Appln. KOKAI Publication No. 2004-158810). In the foregoing charge trap type nonvolatile semiconductor memory, a charge injected to a charge storage insulating film via a tunnel insulating film is trapped in a trap level of the charge storage insulating film. In this way, charges are stored in the charge storage insulating film. Typically, a MONOS or SONOS type nonvolatile semiconductor memory has been known as the charge trap type nonvolatile semiconductor memory.

However, the foregoing charge trap type nonvolatile semiconductor memory has a problem of current characteristic deterioration. For example, leak current resulting from the following factors is given as a problem. One of the factors is concentration of electric line of force at the end portion of a gate structure. The other is process damage (etching damage) at the sidewall of a gate structure.

BRIEF SUMMARY OF THE INVENTION

According to a first aspect of the present invention, there is provided a semiconductor device comprising: an element region having a channel region; and a unit gate structure inducing a channel in the channel region, the unit gate structure including: a tunnel insulating film formed on the element region; a charge storage insulating film formed on the tunnel insulating film; a block insulating film formed on the charge storage insulating film; and a control gate electrode formed on the block insulating film, wherein a distance between the element region and the control gate electrode is shorter at a center portion of the unit gate structure than at both ends thereof, as viewed in a section parallel to a channel width direction.

According to a second aspect of the present invention, there is provided a semiconductor device comprising: an element region having a channel region; and a unit gate structure inducing a channel in the channel region, the unit gate structure including: a tunnel insulating film formed on the element region; a charge storage insulating film formed on the tunnel insulating film; a block insulating film formed on the charge storage insulating film; and a control gate electrode formed on the block insulating film, wherein a distance between the element region and the control gate electrode is shorter at a center portion of the unit gate structure than at both ends thereof, as viewed in a section parallel to a channel length direction.

BRIEF DESCRIPTION OF THE SEVERAL VIEWS OF THE DRAWING

FIGS. 1A and 1B are cross-sectional views schematically showing the structure of a semiconductor device according to a first embodiment of the present invention;

FIG. 7 is a cross-sectional view schematically showing the structure of a semiconductor device according to a second modification example of the first embodiment of the present invention;

FIG. 8 is a cross-sectional view schematically showing the structure of a semiconductor device according to a third modification example of the first embodiment of the present invention;

FIGS. 12 to 16 are cross-sectional views schematically showing a process of manufacturing a semiconductor device according to a second embodiment of the present invention;

FIG. 17 is a cross-sectional view schematically showing the structure of a semiconductor device according to a first modification example of the second embodiment of the present invention;

FIG. 18 is a cross-sectional view schematically showing the structure of a semiconductor device according to a second modification example of the second embodiment of the present invention;

FIGS. 20A, 20B, 21A, 21B, 22A, 22B, 23A, 23B, 24A, 24B, 25A, 25B, 26A and 26B are cross-sectional views schematically showing a process of manufacturing a semiconductor device according to a third embodiment of the present invention;

FIGS. 28 to 31 are cross-sectional views schematically showing a process of manufacturing a semiconductor device according to a fourth embodiment of the present invention;

FIG. 32 is a cross-sectional view schematically showing the structure of a semiconductor device according to a modification example of the fourth embodiment of the present invention;

FIGS. 33A and 33B are cross-sectional views schematically showing the structure of a semiconductor device according to a fifth embodiment of the present invention;

FIGS. 34 to 36 are cross-sectional views schematically showing a process of manufacturing a semiconductor device according to a fifth embodiment of the present invention;

FIGS. 38 to 44 are cross-sectional views schematically showing a process of manufacturing a semiconductor device according to a sixth embodiment of the present invention;

FIGS. 47 to 51 are cross-sectional views schematically showing a process of manufacturing a semiconductor device according to a seventh embodiment of the present invention;

FIGS. 52A and 52B are cross-sectional views schematically showing the structure of a semiconductor device using an SOI substrate according to an embodiment of the present invention.

DETAILED DESCRIPTION OF THE INVENTION

Figure 2:
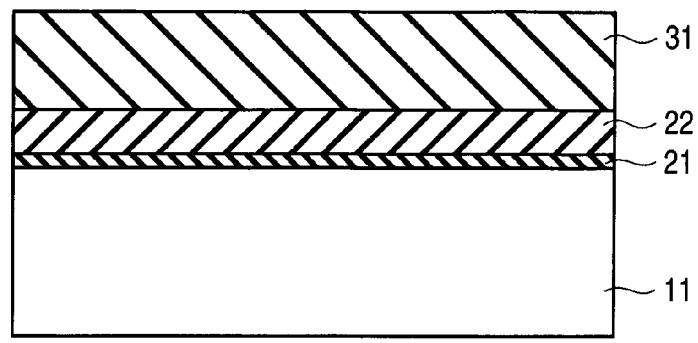
FIGS. 2 to 5 are cross-sectional views schematically showing a process of manufacturing a semiconductor device according to a first embodiment of the present invention.

Various embodiments of the present invention will be hereinafter described with reference to the accompanying drawings. In the following description, a charge trap type nonvolatile semiconductor memory using a charge storage insulating film for charge trap as a charge storage layer is given as one example.

Embodiment 1

FIGS. 1A and 1B are cross-sectional views schematically showing the structure of a semiconductor device according to a first embodiment of the present invention. FIG. 1A is a cross-sectional view taken along a channel width direction (word line direction). FIG. 1B is a cross-sectional view taken along a channel length direction (bit line direction).

A semiconductor substrate (silicon substrate) 11 is provided with an element region 13, which is held between isolation regions 12. The element region 13 has a source region 14, a drain region 15 and a channel region 16 held between the source region 14 and the drain region 15.

A tunnel insulating film 21 is formed on the element region 13. A charge storage insulating film 22 is formed on the tunnel insulating film 21. The tunnel insulating film 21 is made of a silicon oxide. The charge storage insulating film 22 is made of a silicon nitride. According to this embodiment, the foregoing tunnel and charge storage insulating films 21 and 22 are held between the isolation regions 12. The upper surface of the charge storage insulating film 22 is situated at a position lower than the upper surface of the isolation region 12. Thus, the charge storage insulating film 22 is isolated by the isolation region 12.

A block insulating film 23 is continuously formed on the isolation region 12 and the charge storage insulating film 22. According to this embodiment, an alumina film (aluminum oxide film) is used as the foregoing block insulating film 23. A control gate electrode 24 is formed on the block insulating film 23. The control gate electrode 24 functions as a word line, and is formed of a stacked film of polysilicon and tungsten silicide.

A specific portion of the stacked structure of the foregoing tunnel insulating film 21, charge storage insulating film 22, block insulating film 23 and control gate electrode 24 corresponds to a unit gate structure 25. Specifically, a portion for inducing channel in the channel region 16 corresponds to the unit gate structure 25. Accordingly, a portion just above the channel region 16 substantially corresponds to the unit gate structure 25. In other words, of the foregoing stacked structure, a portion situated at a region where a pattern of the element region 13 and a pattern of the control gate electrode 24 intersect corresponds to the unit gate structure 25.

As shown in FIG. 1A, a distance between the element region 13 and the control gate electrode 24 is shorter at the center portion of the unit gate structure 25 than at both ends thereof, as viewed from a direction parallel to the channel length direction. In other words, the distance between the element region 13 and the control gate electrode 24 is shorter at the center portion of the unit gate structure 25 than at both ends thereof, as viewed in the section parallel to the channel width direction. Specifically, the lower surface of the control gate electrode 24 projects at a portion corresponding to the center portion of the unit gate structure 25. In FIG. 1A, preferably, each distance between the projected portion of the control gate electrode 24 and both ends of the unit gate structure 25 is at least 2 nm.

In the foregoing charge trap type nonvolatile semiconductor memory cell, a proper voltage is applied between the control gate electrode 24 and the semiconductor substrate 11. In this way, charges are charged and discharged between the semiconductor substrate 11 and the charge storage insulating film 22 via the tunnel insulating film 21. Specifically, charges injected to the charge storage insulating film 22 via the tunnel insulating film 21 is trapped in a trap level of the charge storage insulating film 22, thereby, charges are stored in the charge storage insulating film 22.

A process of manufacturing a semiconductor device according to this embodiment will be described below. FIGS. 2 to 5 are cross-sectional views (channel width direction (word line direction) schematically showing a process of manufacturing a semiconductor device according to this embodiment.

As shown in FIG. 2, a silicon oxide film having a thickness of about 3 nm is first formed as a tunnel insulating film 21 on a semiconductor substrate (silicon substrate) 11 using thermal oxidization. Then, a silicon nitride film having a thickness of about 5 nm is formed as a charge storage insulating film 22 on the tunnel insulating film 21 using a chemical vapor deposition (CVD) process. A BSG film is further formed as a mask film 31 on the charge storage insulating film 22 using a CVD process.

Figure 3:
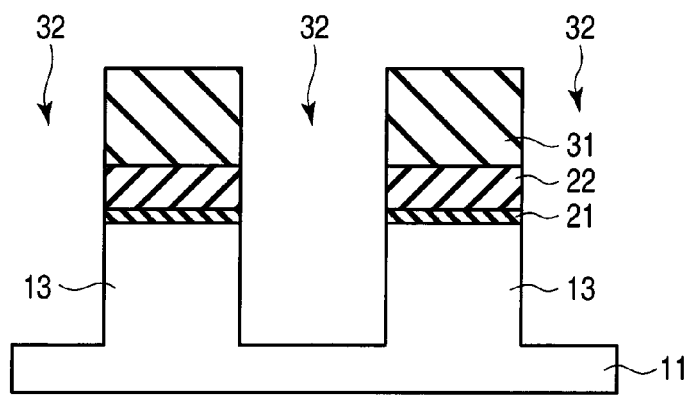

As illustrated in FIG. 3, the mask film 31, the charge storage insulating film 22, the tunnel insulating film 21 and the semiconductor substrate 11 are etched by reactive ion etching (RIE) using a photo resist pattern (not shown) extending to a bit line direction as a mask. As a result, an isolation trench 32 extending to the bit line direction is formed, and thus, an element region 13 is formed between adjacent isolation trenches 32. Each width of the isolation trench 32 and the element region 13 is about 40 nm.

Figure 4:
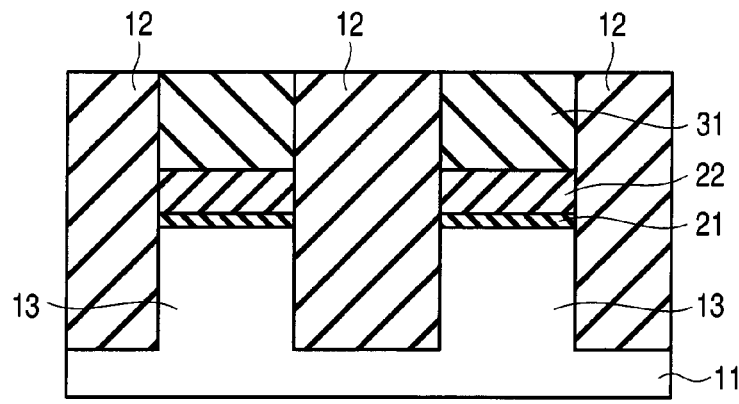

As depicted in FIG. 4, a silicon oxide film is deposited as an isolation insulating film 12 on the entire surface. Thereafter, the isolation insulating film 12 is planarized using chemical mechanical polishing (CMP) to expose the mask film 31. In this way, the following structure is obtained; specifically, the isolation trench 32 is filled with the isolation insulating film 12.

Figure 5:
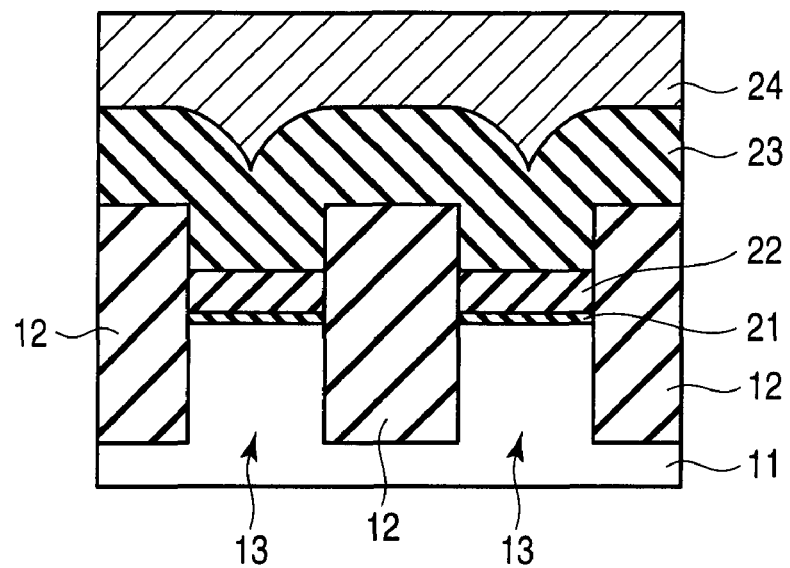

As seen from FIG. 5, the mask film 31 is selectively removed using wet etching. Then, the isolation insulating film 12 is etched using a diluted hydrofluoric acid solution to thin the isolation insulating film 12. For example, the isolation insulating film 12 is etched so that the height of the upper surface of the film 12 is set to about 5 nm with respect to the upper surface of the charge storage insulating film 22.

Thereafter, an alumina film having a thickness of about 30 nm is formed as a block insulating film 23 on the isolation insulating film (isolation region) 12 and the charge storage insulating film 22 via an atomic layer deposition (ALD) process. Then, a control gate electrode film 24 having a thickness of about 100 nm is formed on the block insulating film 23. Specifically, a stacked film of polysilicon and tungsten silicide is formed as the control gate electrode film 24 using CVD process. In this case, the upper surface of the charge storage insulating film 22 is situated at a position lower than the upper surface of the isolation region 12. Therefore, the lower surface of the control gate electrode 24 projects downward.

Although the process after above is not shown, the foregoing control gate electrode film 24, block insulating film 23 and charge storage insulating film 22 are etched by a RIE process using a photo resist pattern extending to the word line direction as a mask. In this way, a pattern of the control gate electrode 24 is formed. An impurity element ion is further implanted to the element region to form a source region and a drain region. In the manner described above, a nonvolatile memory cell shown in FIGS. 1A and 1B is obtained.

According to this embodiment, the control gate electrode 24 projects at a portion corresponding to the center portion of the unit gate structure, as viewed from a direction parallel to the channel length direction, as seen from FIG. 1A. The foregoing structure is provided, and thereby, the distance between the element region 13 and the control gate electrode 24 is shorter at the center portion of the unit gate structure 25 than at both ends thereof. Therefore, an electric field at the center portion of the unit gate structure 25 is higher than that at both ends thereof. This serves to concentrate the electric line of force on the center portion of the unit gate structure 25. As a result, it is possible to prevent a leak current resulting from the following factors. One of the factors is concentration of electric line of force at the corner of both ends of the unit gate structure 25. The other is process damage (etching damage) at both ends of the unit gate structure 25. Moreover, an electric line of force is concentrated on the center portion of the unit gate structure 25 as viewed from a direction parallel to the channel length direction. Therefore, it is possible to increase a controllability of the control gate electrode 24 to the channel region. Accordingly, it is possible to increase on current of a nonvolatile memory cell. As is evident from the foregoing description, according to this embodiment, current characteristics of a memory cell transistor are improved; therefore, it is possible to obtain a semiconductor device, which is excellent in characteristics and reliability.

According to this embodiment, the charge storage insulating film 22 is held between the isolation regions 12, and the upper surface of the film 22 is situated at a position lower than the upper surface of the isolation region 12. Thus, the projected shape of the control gate electrode 24 is easily formed. In addition, the charge storage insulating film 22 is isolated by the isolation region 12. This serves to prevent diffusion of charges stored in the charge storage insulating film 22. In other words, it is possible to prevent charge diffusion between adjacent memory cells in the word line direction. Therefore, in the light of the above description, it is possible to obtain a semiconductor device, which is excellent in electrical characteristics and reliability.

According to this embodiment, the tip end of the projected portion of the control gate electrode 24 is sharp. Thus, this serves to obtain a sufficient controllability of the control gate electrode 24 to the channel region. Accordingly, it is possible to securely increase on current of a memory cell transistor.

Figure 6:
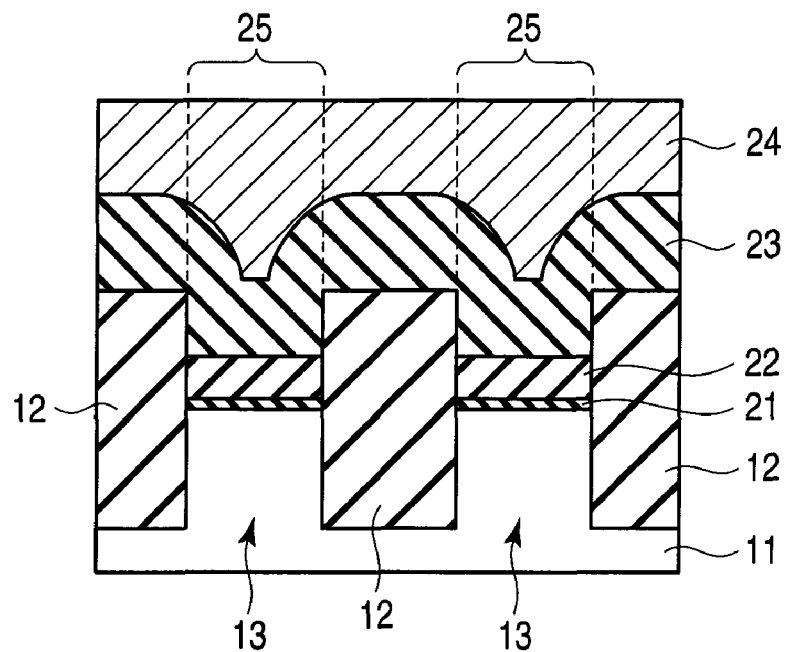
FIG. 6 is a cross-sectional view schematically showing the structure of a semiconductor device according to a first modification example of the first embodiment of the present invention.

FIG. 6 is a cross sectional view (taken along a channel width direction (word line direction)) schematically showing the structure of a semiconductor device according to a first modification example of this embodiment.

According to the first modification example, the tip end of the projected portion of the control gate electrode 24 is flat. The foregoing shape is employed, and thereby, an electric filed is impressed on a wide area to some degree. Thus, a tunnel operation region is made wide; therefore, it is possible to improve write and erase characteristics.

FIG. 7 is a cross sectional view (taken along a channel width direction (word ling direction)) schematically showing the structure of a semiconductor device according to a second modification example of this embodiment.

According to the second modification example, the tip end of the projected portion of the control gate electrode 24 is rounded. As described above, the tip end of the projected portion is rounded; therefore, this serves to reduce concentration of the electric line of force. As a result, field stress concentration is relaxed, and thus, it is possible to prevent characteristic deterioration due to the field stress concentration.

FIG. 8 is a cross sectional view (taken along a channel width direction (word ling direction)) schematically showing the structure of a semiconductor device according to a third modification example of this embodiment.

According to the third modification example, the block insulating film 23 is held between the isolation regions 12. The block insulating film 23 is not formed on the upper surface of the isolation region 12. Thus, the block insulating film 23 is isolated by the isolation region 12. Even if the foregoing structure is provided, the same effect as the foregoing embodiment is obtained.

Figure 9:
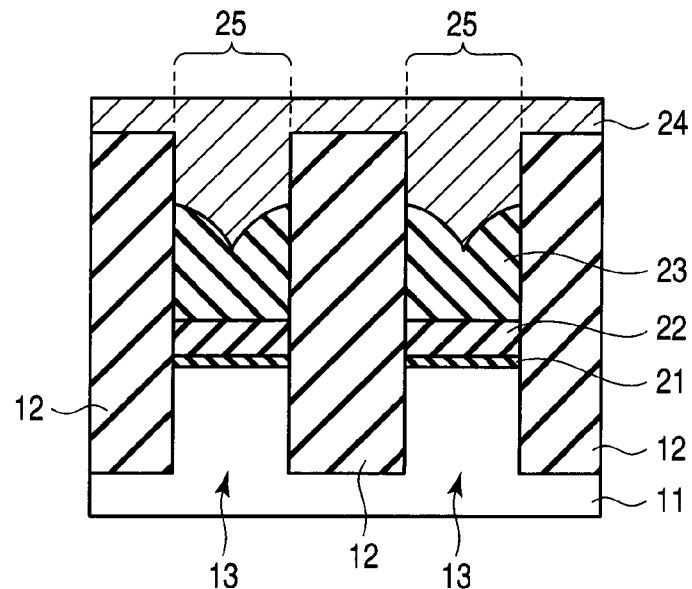
FIG. 9 is a cross-sectional view schematically showing the structure of a semiconductor device according to a fourth modification example of the first embodiment of the present invention.

FIG. 9 is a cross sectional view (taken along a channel width direction (word line direction)) schematically showing the structure of a semiconductor device according to a fourth modification example of this embodiment.

According to the fourth modification example, the block insulating film 23 is held between the isolation regions 12, like the third modification example. The block insulating film 23 is not formed on the upper surface of the isolation region 12. Thus, the block insulating film 23 is isolated by the isolation region 12. Even if the foregoing structure is provided, the same effect as the foregoing embodiment is obtained.

Figure 10:
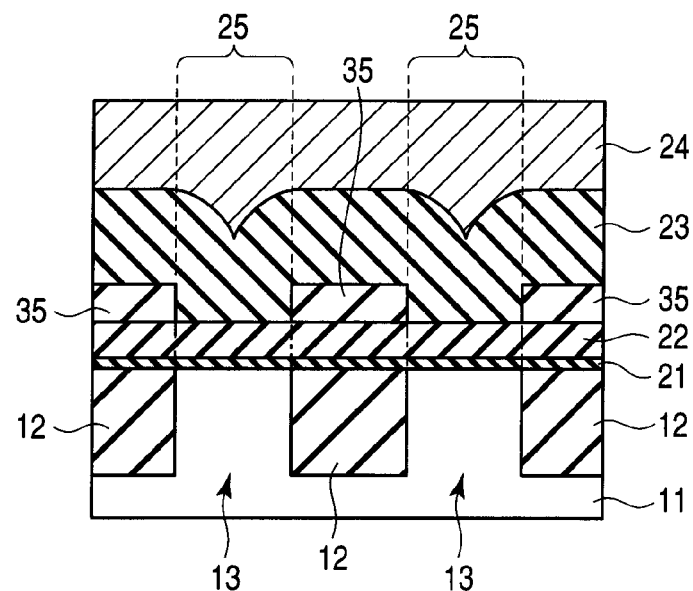
FIG. 10 is a cross-sectional view schematically showing the structure of a semiconductor device according to a fifth modification example of the first embodiment of the present invention.

FIG. 10 is a cross sectional view (taken along a channel width direction (word line direction)) schematically showing the structure of a semiconductor device according to a fifth modification example of this embodiment.

According to the fifth modification example, the tunnel insulating film 21 and the charge storage insulating film 22 are not held between the isolation regions 12. Therefore, the charge storage insulating film 22 is not isolated by the isolation region 12. The charge storage insulating film 22 is also formed on the isolation region 12. Moreover, an auxiliary insulating film 35 is formed above the isolation region 12 with the tunnel insulating film 21 and the charge storage insulating film 22 interposed therebetween. Thus, even if the upper surface of the charge storage insulating film 22 is flat, the lower surface of the control gate electrode 24 is projected. Therefore, even if the foregoing structure is provided, the same effect as the foregoing embodiment is basically obtained.

Embodiment 2

Figure 11A:
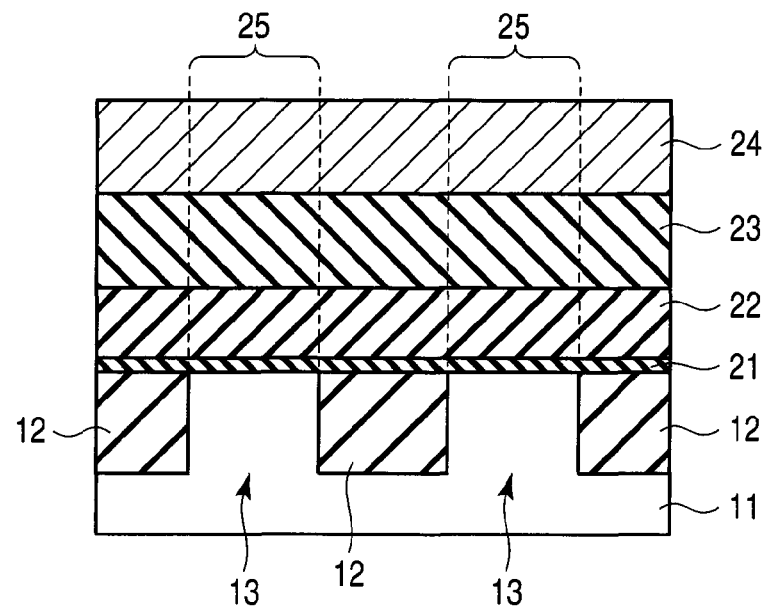
FIGS. 11A and 11B are cross-sectional views schematically showing the structure of a semiconductor device according to a second embodiment of the present invention.
Figure 11B:
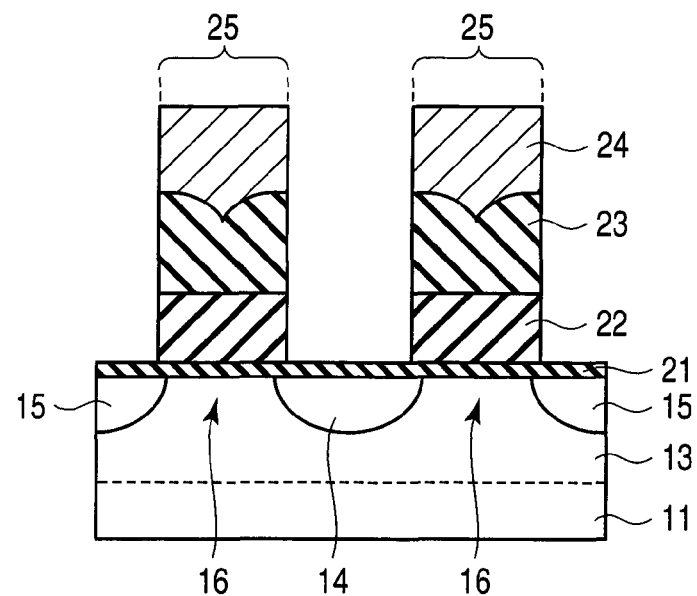

FIGS. 11A and 11B are cross-sectional views schematically showing the structure of a semiconductor device according to a second embodiment of the present invention. FIG. 11A is a cross-sectional view taken along a channel width direction (word line direction). FIG. 11B is a cross-sectional view taken along a channel length direction (bit line direction). The structure of the second embodiment is basically the same as the first embodiment; therefore, the explanation about the matters described in the first embodiment is omitted.

According to this embodiment, as shown in FIG. 11B, a distance between an element region 13 and a control gate electrode 24 is shorter at the center portion of a unit gate structure 25 than at both ends thereof, as viewed from a direction parallel to a channel width direction. In other words, the distance between the element region 13 and the control gate electrode 24 is shorter at the center portion of the unit gate structure 25 than at both ends thereof, as viewed in a section parallel to a channel length direction. For example, the lower surface of the control gate electrode 24 projects at a portion corresponding to the center portion of the unit gate structure 25. Preferably, in FIG. 11B, each distance between the projected portion of the control gate electrode 24 and both ends of the unit gate structure 25 is at least 2 nm.

The following is an explanation about a process of manufacturing a semiconductor device according to this embodiment. FIGS. 12 to 16 are cross-sectional views (taken along channel length direction (bit line direction)) schematically showing a process of manufacturing a semiconductor device according to this embodiment.

Figure 12:
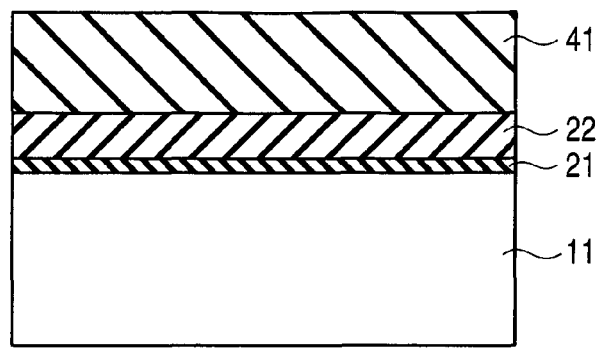

According to the process of FIG. 12, a semiconductor substrate (silicon substrate) 11 is formed with an isolation trench (not shown) extending to the bit line direction. Thereafter, the isolation trench is filled with an isolation insulating film (not shown). In this way, isolation regions (not shown) and an element region held between the isolation regions are formed. The foregoing isolation region and element region have a structure shown in FIG. 11A. Namely, each upper surface of the isolation region 12 and the element region 13 is planarized.

Then, a silicon oxide film having a thickness of about 3 nm is formed as a tunnel insulating film 21 on the semiconductor substrate 11 formed with the isolation region and the element region using thermal oxidization. A silicon nitride film having a thickness of about 5 nm is formed as a charge storage insulating film 22 on the tunnel insulating film 21 via a CVD process. Further, a BSG film is formed as a mask film 41 on the charge storage insulating film 22 via a CVD process.

Figure 13:
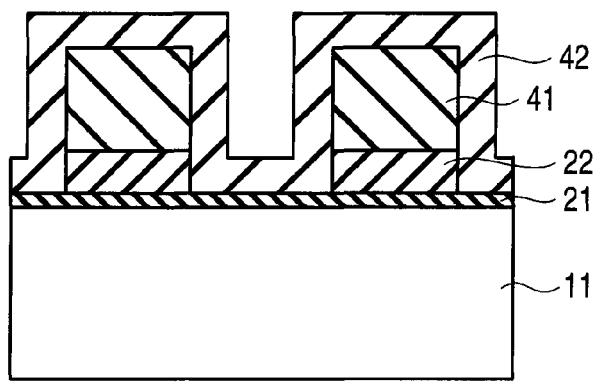

As illustrated in FIG. 13, the mask film 41 and the charge storage insulating film 22 are etched via RIE using a photo resist pattern (not shown) extending to the word line direction. The photo resist pattern is removed, and thereafter, a silicon oxide film having a thickness of about 10 nm is formed as a sidewall film 42 on the entire surface including each sidewall of the charge storage insulating film 22 and the mask film 41 using a CVD process.

Figure 14:
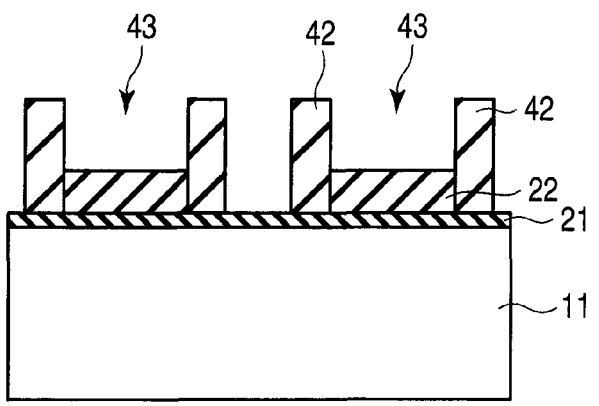

As depicted in FIG. 14, the sidewall film 42 is etched using anisotropic etching such as RIE. As a result, the upper surface of the mask film 41 is exposed and the sidewall film 42 remains on a sidewall of the charge storage insulating film 22 and the mask film 41. Further, the exposed mask film 41 is selectively removed using wet etching. In this way, a trench 43 held between the sidewall films 42 is formed.

As seen from FIG. 15, a block insulating film 23 is formed on the entire surface to cover the charge storage insulating film 22 and the sidewall film 42. For example, an alumina film having a thickness of about 30 nm is formed as the block insulating film 23 using an ALD process. Further, a control gate electrode film 24 having a thickness of 100 nm is formed on the block insulating film 23. For example, a stacked film of polysilicon and tungsten silicide is formed as the control gate electrode film 24 using a CVD process. In this case, the upper surface of the charge storage insulating film 22 is situated at a position lower than the upper surface of the sidewall film 42. Therefore, the lower surface of the control gate electrode 24 projects downward.

As shown in FIG. 16, the foregoing control gate electrode film 24, block insulating film 23, and the like, are etched via RIE using a photo resist pattern (not shown) extending to the word line direction as a mask. In this way, a pattern of the control gate electrode 24 is formed.

Although the process after that is not shown, impurity element ion is implanted to the element region to form a source region and a drain region. In the manner described above, a nonvolatile memory cell shown in FIGS. 11A and 11B is obtained.

According to this embodiment, the control gate electrode 24 projects at a portion corresponding to the center portion of the unit gate structure 25, as viewed from a direction parallel to the channel width direction, as shown in FIG. 11B. Thus, the distance between the element region 13 and the control gate electrode 24 is shorter at the center portion of the unit gate structure 25 than at both ends thereof. Therefore, this serves to make larger an electric field of the center portion of the unit gate structure 25 than that of the end portion of the unit gate structure 25. Therefore, the electric line of force is concentrated on the center portion of the unit gate structure 25. As a result, leak current resulting from the following factors is prevented. One of the factors is concentration of electric line of force on each corner of both ends of the unit gate structure 25. The other is process damage (etching damage) at both ends of the unit gate structure 25. In addition, the electric line of force is concentrated on the center portion of the unit gate structure 25, as viewed from a direction parallel to the channel width direction. This serves to concentrate the electric line of force on the center portion of a channel region 16. As a result, controllability of the control gate electrode 24 to the channel region 16 is increased. Therefore, it is possible to improve cutoff characteristics of a nonvolatile memory cell. As is evident from the above description, according to this embodiment, it is possible to improve current characteristics of a memory cell transistor, and thus, to obtain a semiconductor device, which is excellent in characteristics and reliability.

According to this embodiment, the upper surface of the charge storage insulating film 22 is situated at a position lower than the upper surface of the sidewall film 42 as seen from FIGS. 14 and 15. Therefore, a projected shape of the control gate electrode 24 is easily formed.

According to this embodiment, the tip end of the projected portion of the control gate electrode 24 is sharp. Therefore, this serves to sufficiently increase the controllability of the control gate electrode 24 to the channel region 16. As a result, it is possible to securely improve cutoff characteristics of a memory cell transistor.

FIG. 17 is a cross sectional view (taken along a channel length direction (bit line direction)) schematically showing the structure of a semiconductor device according to a first modification example of this embodiment.

According to the first modification example, the tip end of the projected portion of the control gate electrode 24 is flat. The foregoing shape is employed, and thereby, an electric line of force is concentrated on a wide area to some degree. Thus, a tunnel operation region is made wide; therefore, it is possible to improve write and erase characteristics.

FIG. 18 is a cross sectional view (taken along a channel length direction (bit line direction)) schematically showing the structure of a semiconductor device according to a second modification example of this embodiment.

According to the second modification example, the tip end of the projected portion of the control gate electrode 24 is rounded. As described above, the tip end of the projected portion is rounded; therefore, this serves to reduce concentration of electric line of force. As a result, field stress concentration is relaxed, and thus, it is possible to prevent characteristic deterioration due to the field stress concentration.

Embodiment 3

Figure 19A:
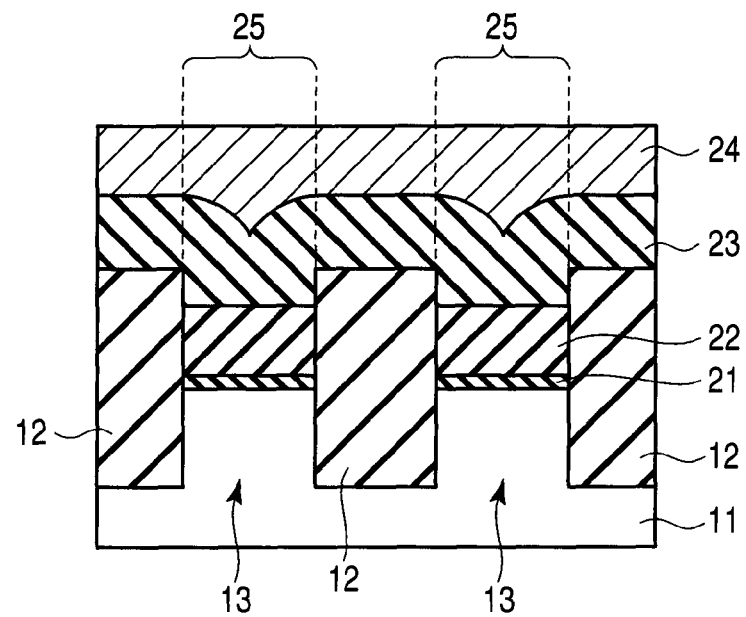
FIGS. 19A and 19B are cross-sectional views schematically showing the structure of a semiconductor device according to a third embodiment of the present invention.
Figure 19B:
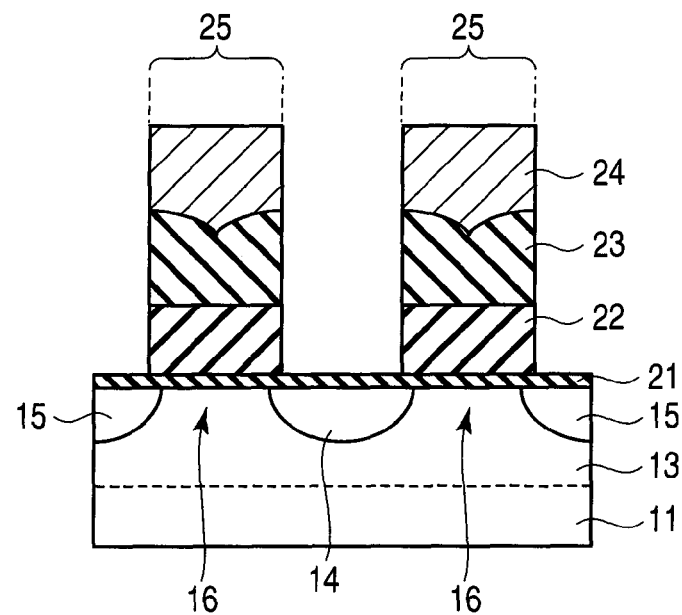

FIGS. 19A and 19B are cross-sectional views schematically showing the structure of a semiconductor device according to a third embodiment of the present invention. FIG. 19A is a cross-sectional view taken along a channel width direction (word line direction). FIG. 19B is a cross-sectional view taken along a channel length direction (bit line direction). The structure of the third embodiment is basically the same as the first and second embodiments; therefore, the explanation about the matters described in the first and second embodiments is omitted.

As seen from FIGS. 19A and 19B, the sectional shape (see FIG. 19A) of the semiconductor device of this embodiment is the same as the first embodiment (see FIG. 1A), in the channel width direction. Moreover, the sectional shape (see FIG. 19B) of the semiconductor device of this embodiment is the same as the second embodiment (see FIG. 11B), in the channel length direction.

As shown in FIG. 19A, a distance between an element region 13 and a control gate electrode 24 is shorter at the center portion of a unit gate structure 25 than at both ends thereof, as viewed from a direction parallel to a channel length direction. In other words, the distance between the element region 13 and the control gate electrode 24 is shorter at the center portion of the unit gate structure 25 than at both ends thereof, as viewed in a section parallel to a channel width direction. For example, the lower surface of the control gate electrode 24 projects at a portion corresponding to the center portion of the unit gate structure 25, as viewed from a direction parallel to a channel length direction.

As shown in FIG. 19B, a distance between an element region 13 and a control gate electrode 24 is shorter at the center portion of a unit gate structure 25 than at both ends thereof, as viewed from a direction parallel to a channel width direction. In other words, the distance between the element region 13 and the control gate electrode 24 is shorter at the center portion of the unit gate structure 25 than at both ends thereof, as viewed in a section parallel to a channel length direction. For example, the lower surface of the control gate electrode 24 projects at a portion corresponding to the center portion of the unit gate structure, as viewed from a direction parallel to a channel width direction.

The following is an explanation about a process of manufacturing a semiconductor device according to this embodiment. FIGS. 20A and 20B to FIGS. 26A and 26B are sectional views schematically showing a process of manufacturing a semiconductor device according to this embodiment. FIGS. 20A to 26A are cross-sectional views taken along a channel width direction (word line direction). FIGS. 20B to 26B are cross-sectional views taken along a channel length direction (bit line direction).

As shown in FIGS. 20A and 20B, a silicon oxide film having a thickness of about 3 nm is formed as a tunnel insulating film 21 on a semiconductor substrate (silicon substrate) 11 using thermal oxidization. A silicon nitride film having a thickness of about 5 nm is formed as a charge storage insulating film 22 on the tunnel insulating film 21 via a CVD process. Further, a BSG film is formed as a mask film 51 on the charge storage insulating film 22.

As illustrated in FIGS. 21A and 21B, the foregoing mask film 51, charge storage insulating film 22, tunnel insulating film 21 and semiconductor substrate 11 are etched via RIE using a photo resist pattern (not shown) extending to the bit line direction as a mask. As a result, an isolation trench extending to the bit line direction is formed, and an element region 13 is formed between adjacent isolation trenches. The photo resist pattern is removed, and thereafter, a silicon oxide film is deposited as an isolation insulating film 12 on the entire surface. Further, the isolation insulating film 12 is planarized using CMP to expose the mask film 51. In this way, the following structure is obtained; specifically, the isolation trench is filled with the isolation insulating film 12.

As depicted in FIGS. 22A ad 22B, the mask film 51 and the charge storage insulating film 22 are etched via RIE using a photo resist pattern (not shown) extending to the word line direction as a mask. The photo resist pattern is removed, and thereafter, an amorphous silicon film is formed as a sidewall film 52 on the entire surface including a sidewall of the charge storage insulating film 22 and the mask film 51.

As seen from FIGS. 23A and 23B, the sidewall film 52 is etched using anisotropic etching such as RIE. As a result, the upper surface of the mask film 51 is exposed, and the sidewall film 52 remains on a sidewall of the charge storage insulating film 22 and the mask film 51.

As shown in FIGS. 24A and 24B, the exposed mask film 51 is selectively removed using wet etching. In this way, a recess 53 held between the isolation insulating films (isolation insulating regions) 12 and the sidewall films 52.

As depicted in FIGS. 25A and 25B, an alumina film is formed as a block insulating film 23 on the entire surface using an ALD process. Then, a control gate electrode film 24 is formed on the block insulating film 23. For example, a stacked film of polysilicon and tungsten silicide is formed as the control gate electrode film 24 using a CVD process. In this case, the upper surface of the charge storage insulating film 22 is situated at a position lower than each upper surface of the isolation region 12 and the sidewall film 52. Thus, the lower surface of the control gate electrode film 24 projects downward. Namely, the lower surface of the control gate electrode film 24 projects downward in both a section (see FIG. 25A) parallel to the channel width direction and a section (see FIG. 25B) parallel to the channel length direction.

As seen from FIGS. 26A and 26B, the control gate electrode film 24, the block insulating film 23, and the like, are etched via RIE using a photo resist pattern (not shown) extending to the word line direction as a mask. In this way, a pattern of the control gate electrode 24 is formed.

Although the process after that is not shown, impurity element ion is implanted to the element region to form a source region and a drain region. In the manner described above, a nonvolatile memory cell shown in FIGS. 19A and 19B is obtained.

As described above, according to this embodiment, the semiconductor device has the following sectional shapes. One is the same channel width direction sectional shape as the first embodiment. The other is the same channel length direction sectional shape as the second embodiment. Therefore, the same effect as the first and second embodiments is obtained. Specifically, it is possible to prevent a leak current resulting from concentration of electric line of force and process damage. In addition, it is possible to increase the controllability of the control gate electrode to the channel region. This serves to improve on/off operation characteristics of a memory cell transistor. Therefore, it is possible to obtain a semiconductor device, which is excellent in characteristics and reliability.

In this embodiment, the same structure of various modification examples described in the first and second embodiments is employed.

Embodiment 4

Figure 27A:
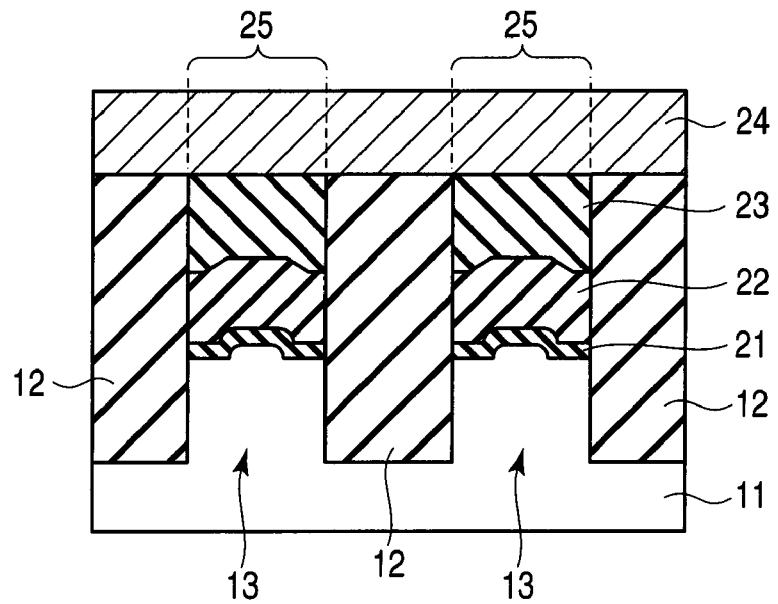
FIGS. 27A and 27B are cross-sectional views schematically showing the structure of a semiconductor device according to a fourth embodiment of the present invention.
Figure 27B:
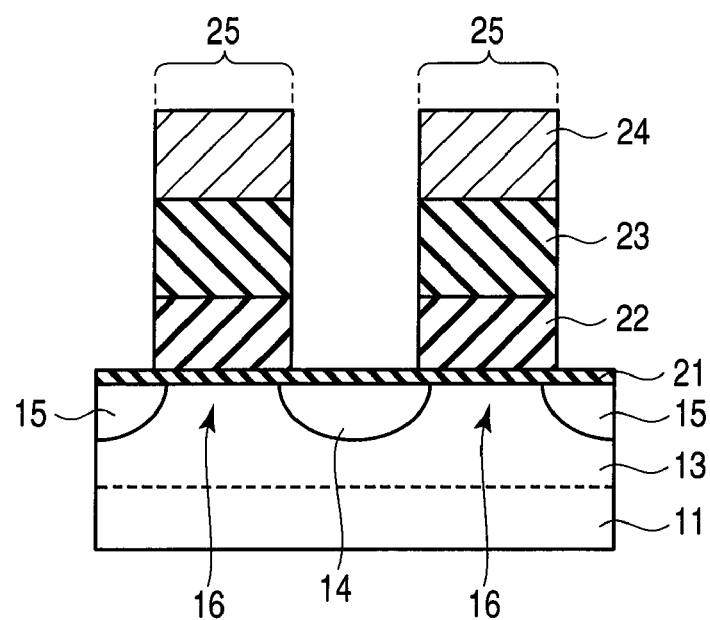

FIGS. 27A and 27B are cross-sectional views schematically showing the structure of a semiconductor device according to a fourth embodiment of the present invention. FIG. 27A is a cross-sectional view taken along a channel width direction (word line direction). FIG. 27B is a cross-sectional view taken along a channel length direction (bit line direction). The structure of the fourth embodiment is basically the same as the first embodiment; therefore, the explanation about the matters described in the first embodiment is omitted.

As shown in FIG. 27A, a distance between an element region 13 and a control gate electrode 24 is shorter at the center portion of a unit gate structure 25 than at both ends thereof, as viewed from a direction parallel to a channel length direction. In other words, the distance between the element region 13 and the control gate electrode 24 is shorter at the center portion of the unit gate structure 25 than at both ends thereof, as viewed in a section parallel to a channel width direction. For example, the upper surface of the element region 13 projects at a portion corresponding to the center portion of the unit gate structure 25. Preferably, in FIG. 27A, each distance between the projected portion of the element region 13 and both ends of the unit gate structure 25 is at least 2 nm.

The following is an explanation about a process of manufacturing a semiconductor device according to this embodiment. FIGS. 28 to 31 are cross-sectional views (taken along channel width direction (word line direction)) schematically showing a process of manufacturing a semiconductor device according to this embodiment.

Figure 28:
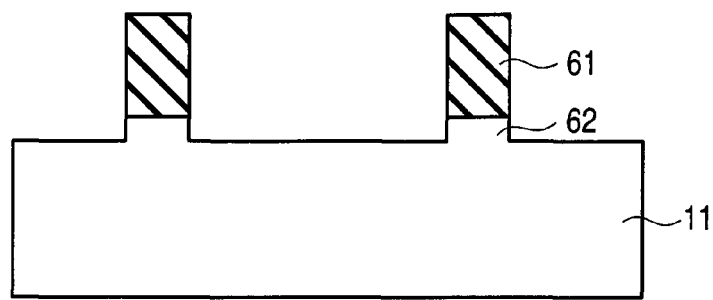

As shown in FIG. 28, a silicon nitride film is formed as a mask film 61 on a semiconductor substrate (silicon substrate) 11 using a CVD process. Then, the mask film 61 is etched via RIE using a photo resist pattern (not shown) extending to the bit line direction as a mask. Further, the semiconductor substrate 11 is etched. As a result, the surface of the semiconductor substrate 11 is formed with a projected portion 62, which extends to the bit line direction. For example, the height of the projected portion 62 is about 5 nm. Generally, it is preferable that the height of the projected portion 62 is set to a range from 1/20 to two times as much as the width of the element region 13 (see FIG. 27A).

Figure 29:
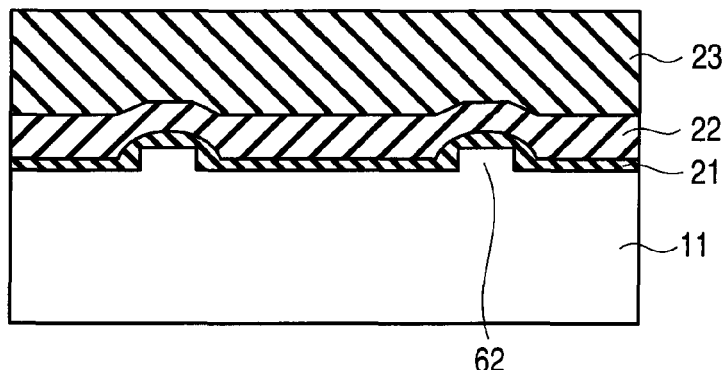

As illustrated in FIG. 29, the mask film 61 is selectively removed by etching to expose the upper surface of the projected portion 62. Thereafter, a silicon oxide film having a thickness of about 3 nm is formed as a tunnel insulating film 21 on the semiconductor substrate 11 using thermal oxidization. Then, a silicon nitride film having a thickness of about 5 nm is formed as a charge storage insulating film 22 using a CVD process. An alumina film having a thickness of about 50 nm is formed as a block insulating film 23 on the charge storage insulating film 22 using an ALD process. Further, the surface of the block insulating film 23 is planarized using CMP. The thickness of the block insulating film 23 after being planarized is about 30 nm.

Figure 30:
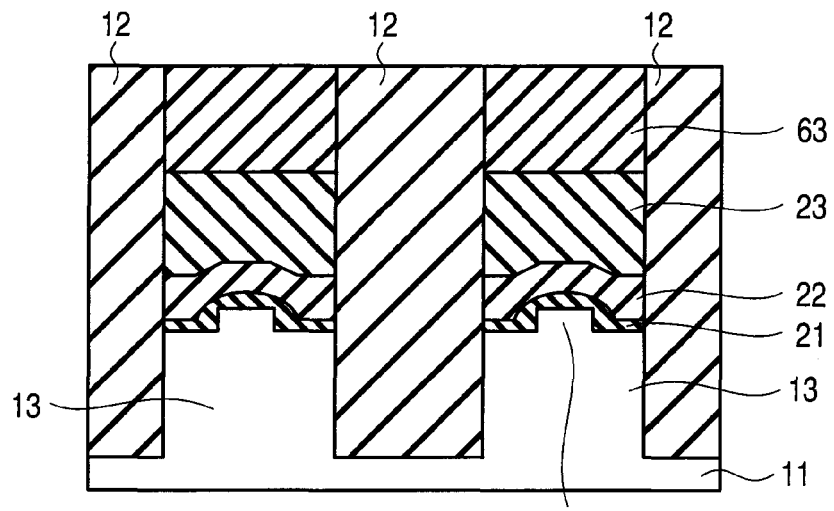

As depicted in FIG. 30, a silicon nitride film is formed as a mask film 63 using a CVD process. Then, the foregoing mask film 63, block insulating film 23, charge storage insulating film 22, tunnel insulating film 21 and semiconductor substrate 11 are etched via RIE using a photo resist pattern (not shown) extending to the bit line direction as a mask. As a result, an isolation trench (having a depth of about 100 nm) extending to the bit line direction is formed, and an element region 13 is formed between adjacent isolation trenches. Thereafter, a silicon oxide film is deposited as an isolation insulating film 12 on the entire surface. Then, the surface of the isolation insulating film 12 is planarized via CMP using the mask film 63 as a stopper. In this way, the following structure is obtained; specifically, the isolation trench is filled with the isolation insulating film 12.

As seen from FIG. 31, the mask film 63 is selectively removed by wet etching to expose the upper surface of the block insulating film 23. Then, the isolation insulating film 12 is etched using a diluted hydrofluoric acid solution so that the upper surface of the isolation insulating film 12 is flush with that of the block insulating film 23. Thereafter, a control gate electrode film 24 having a thickness of about 100 nm is formed on the isolation insulating film (isolation region) 12 and the block insulating film 23. For example, a stacked film of polysilicon and tungsten silicide is formed as the control gate electrode film 24 using a CVD process.

Although the process after that is not shown, the foregoing control gate electrode film 24, block insulating film 23 and charge storage insulating film 22 are etched via RIE using a photo resist pattern extending to the word line direction as a mask. In this way, a pattern of the control gate electrode 24 is formed. Further, impurity element ion is implanted to the element region to form a source region and a drain region. In the manner described above, a nonvolatile memory cell shown in FIGS. 27A and 27B is obtained.

According to this embodiment, as shown in FIG. 27A, the element region 13 projects at a portion corresponding to the center portion of the unit gate structure 25, as viewed from a direction parallel to the channel length direction. Thus, the distance between the element region 13 and the control gate electrode 24 is shorter at the center portion of the unit gate structure 25 than at both ends thereof. Therefore, this serves to make larger an electric field of the center portion of the unit gate structure 25 than that of the end portion of the unit gate structure 25. Therefore, the electric line of force is concentrated on the center portion of the unit gate structure 25. Therefore, the same effect as the first embodiment is obtained. Specifically, it is possible to prevent a leak current resulting from concentration of electric line of force and process damage. In addition, controllability of the control gate electrode to the channel region is increased. This serves to improve on current characteristics of a memory cell transistor. Therefore, it is possible to obtain a semiconductor device, which is excellent in characteristics and reliability.

According to this embodiment, the charge storage insulating film 22 is held between the isolation regions 12, and the charge storage insulating film 22 is isolated by the isolation region 12. Thus, this serves to prevent diffusion of charges stored in the charge storage insulating film 22. In other words, charge diffusion is prevented between adjacent memory cells in the word line direction. As is evident from the above description, it is possible to obtain a semiconductor device, which is excellent in characteristics and reliability.

FIG. 32 is a cross sectional view (taken along a channel width direction (word line direction)) schematically showing the structure of a semiconductor device according to a modification example of this embodiment.

According to this modification example, a tunnel insulating film 21 and a charge storage insulating film 22 are not held between isolation regions 12. Accordingly, the charge storage insulating film 22 is not isolated by the isolation region 12.

The charge storage insulating film 22 is also formed on the isolation region 12. Even if the foregoing structure is provided, basically, the same effect as the foregoing embodiment is obtained.

Embodiment 5

FIGS. 33A and 33B are cross-sectional views schematically showing the structure of a semiconductor device according to a fifth embodiment of the present invention. FIG. 33A is a cross-sectional view taken along a channel width direction (word line direction). FIG. 33B is a cross-sectional view taken along a channel length direction (bit line direction). The structure of the fifth embodiment is basically the same as the first to third embodiment; therefore, the explanation about the matters described in the first to third embodiments is omitted.

As shown in FIG. 33B, a distance between an element region 13 and a control gate electrode 24 is shorter at the center portion of a unit gate structure 25 than at both ends thereof, as viewed from a direction parallel to a channel width direction. In other words, the distance between the element region 13 and the control gate electrode 24 is shorter at the center portion of the unit gate structure 25 than at both ends thereof, as viewed in a section parallel to a channel length direction. For example, the upper surface of the element region 13 projects at a portion corresponding to the center portion of the unit gate structure 25. Preferably, in FIG. 33B, each distance between the projected portion of the element region 13 and both ends of the unit gate structure 25 is at least 2 nm.

The following is an explanation about a process of manufacturing a semiconductor device according to this embodiment. FIGS. 34 to 36 are cross-sectional views (taken along channel length direction (bit line direction) schematically showing a process of manufacturing a semiconductor device according to this embodiment.

First, according the process of FIG. 34, a semiconductor substrate (silicon substrate) 11 is formed with an isolation trench (not shown) extending to the bit line direction. Then, the isolation trench is filled with an isolation insulating film (not shown). In this way, isolation regions (not shown) and an element region held between the isolation regions are formed. The isolation region and the element region have the structure shown in FIG. 33A. Namely, each upper surface of the isolation region 12 and the element region 13 is planarized.

A silicon nitride film is formed as a mask film 71 on the semiconductor substrate 11 using a CVD process. Then, the mask film 71 is etched via RIE using a photo resist pattern (not shown) extending to the word line direction as a mask. Further, the semiconductor substrate 11 is etched. As a result, the surface of the semiconductor substrate 11 is formed with a projected portion 72, which extends to the word line direction. For example, the height of the projected portion 72 is about 5 nm. Generally, it is preferable that the height of the projected portion 72 is set to a range from 1/20 to two times as much as the width in the channel length direction of the unit gate structure 25 (see FIG. 33B).

As illustrated in FIG. 35, the mask film 71 is selectively removed by etching to expose the upper surface of the projected portion 72. Thereafter, a silicon oxide film having a thickness of about 3 nm is formed as a tunnel insulating film 21 on the semiconductor substrate 11 using thermal oxidization. Then, a silicon nitride film having a thickness of about 5 nm is formed as a charge storage insulating film 22 using a CVD process. An alumina film having a thickness of about 50 nm is formed as a block insulating film 23 on the charge storage insulating film 22 using an ALD process. Further, the surface of the block insulating film 23 is planarized using CMP. The thickness of the block insulating film 23 after being planarized is about 30 nm.

As depicted in FIG. 36, a control gate electrode film 24 having a thickness of about 100 nm is formed on the block insulating film 23. For example, a stacked film of polysilicon and tungsten silicide is formed as the control gate electrode film 24 using a CVD process. Thereafter, the foregoing control gate electrode film 24, block insulating film 23 and charge storage insulating film 22 are etched via RIE using a photo resist pattern (not shown) extending to the word line direction as a mask. In this way, a pattern of the control gate electrode 24 is formed.

Although the process after that is not shown, impurity element ion is implanted to the element region to form a source region and a drain region. In the manner described above, a nonvolatile memory cell shown in FIGS. 33A and 33B is obtained.

According to this embodiment, the element region 13 projects at a portion corresponding to the center portion of the unit gate structure 25, as viewed from a direction parallel to the channel width direction, as seen from FIG. 33B. Thus, the distance between the element region 13 and the control gate electrode 24 is shorter at the center portion of the unit gate structure 25 than at both ends thereof. Therefore, this serves to make larger an electric filed of the center portion of the unit gate structure 25 than that of the end portion of the unit gate structure 25. This makes it possible to concentrate an electric line of force at the center portion of the unit gate structure 25. Therefore, the same effect as the second embodiment is obtained. Specifically, it is possible to prevent a leak current resulting from concentration of electric line of force and process damage. In addition, controllability of the control gate electrode to the channel region is increased. This serves to improve cutoff characteristics of a memory cell transistor. Therefore, it is possible to obtain a semiconductor device, which is excellent in characteristics and reliability.

Incidentally, the structure combining the foregoing fourth and fifth embodiments may be employed. For example, the following structure may be employed. Specifically, the sectional shape is the same as FIG. 27A of the fourth embodiment in the channel width direction. Further, the sectional shape is the same as FIG. 33B of the fifth embodiment in the channel length direction. In this case, the same effect as obtained by the fourth and fifth embodiment is obtained. Namely, it is possible to prevent a leak current resulting from concentration of electric line of force and process damage. In addition, controllability of the control gate electrode to the channel region is increased. This serves to improve on/off operation characteristics of a memory cell transistor.

Embodiment 6

Figure 37:
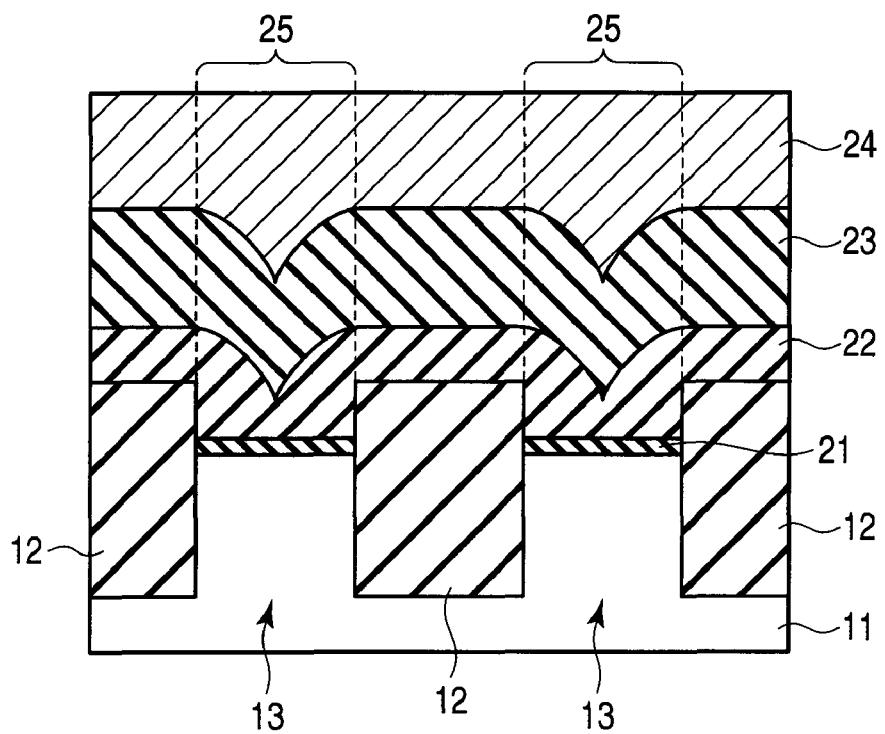
FIG. 37 is a cross-sectional view schematically showing the structure of a semiconductor device according to a sixth embodiment of the present invention.

FIG. 37 is a cross-sectional view taken along a channel width direction (word line direction) schematically showing the structure of a semiconductor device according to a sixth embodiment of the present invention. The structure of the sixth embodiment is basically the same as the first embodiment; therefore, the explanation about the matters described in the first embodiment is omitted.

As shown in FIG. 37, a distance between an element region 13 and a control gate electrode 24 is shorter at the center portion of a unit gate structure 25 than at both ends thereof, as viewed from a direction parallel to a channel length direction. In other words, the distance between the element region 13 and the control gate electrode 24 is shorter at the center portion of the unit gate structure 25 than at both ends thereof, as viewed in a section parallel to a channel width direction. For example, the lower surface of the control gate electrode 24 projects at a portion corresponding to the center portion of the unit gate structure 25. In addition, the lower surface of the block insulating film 23 projects at a portion corresponding to the center portion of the unit gate structure 25.

The following is an explanation about a process of manufacturing a semiconductor device according to this embodiment. FIGS. 38 to 44 are cross-sectional views (take along channel width direction (word line direction)) schematically showing a process of manufacturing a semiconductor device according to this embodiment.

Figure 38:
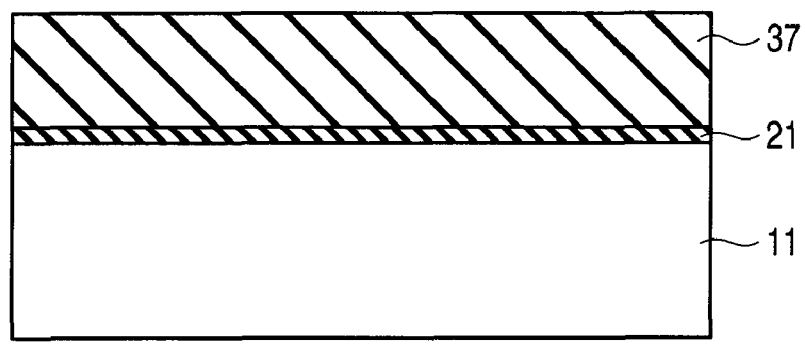

As shown in FIG. 38, a silicon oxide film having a thickness of about 3 nm is first formed as a tunnel insulating film 21 on a semiconductor substrate (silicon substrate) 11 using thermal oxidization. Then, silicon nitride film is formed as a mask film 37 on the tunnel insulating film 21 using a CVD process.

As illustrated in FIG. 39, the foregoing mask film 37, tunnel insulating film 21 and semiconductor substrate 11 are etched by RIE using a photo resist pattern (not shown) extending to a bit line direction as a mask. As a result, an isolation trench 32 extending to the bit line direction is formed, and an element region 13 is formed between adjacent isolation trenches 32. Each width of the isolation trench 32 and an element region 13 is about 40 nm.

As depicted in FIG. 40, a silicon oxide film is deposited as an isolation insulating film 12 on the entire surface. Thereafter, the isolation insulating film 12 is planarized using CMP to expose the mask film 37. In this way, the following structure is obtained; specifically, the isolation trench 32 is filled with the isolation insulating film 12.

As seen from FIG. 41, the isolation insulating film 12 is etched using a diluted hydrofluoric acid solution to thin the isolation insulating film 12. For example, the isolation insulating film 12 is etched so that the height of the upper surface of the film 12 is set to about 5 nm with respect to the upper surface of the tunnel insulating film 21.

As shown in FIG. 42, the mask film 37 is selectively removed using a chemical solution.

Figure 43:
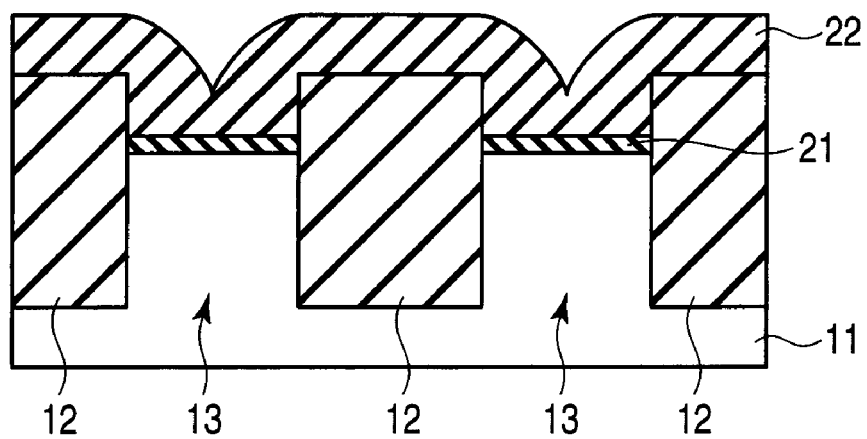

As illustrated in FIG. 43, a silicon nitride film having a thickness of about 5 nm is formed as a charge storage insulating film 22 on the isolation insulating film (isolation region) 12 and the tunnel insulating film 21 using a CVD process.

Figure 44:
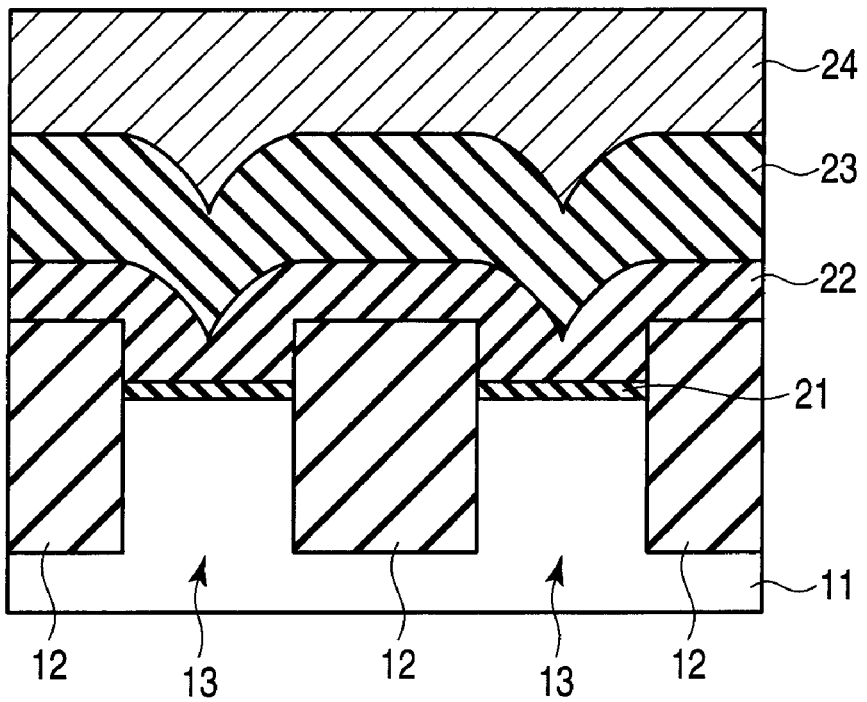

As depicted in FIG. 44, an alumina film having a thickness of about 30 nm is formed as a block insulating film 23 on the charge storage insulating film 22 via an atomic layer deposition (ALD) process. Then, a control gate electrode film 24 having a thickness about 100 nm is formed on the block insulating film 23. For example, a stacked film of polysilicon and tungsten silicide is formed as the control gate electrode film 24 using a CVD process. In this case, the upper surface of the tunnel insulating film 21 is situated at a position lower than the upper surface of the isolation region 12. Therefore, each lower surface of the block insulating film 23 and the control gate electrode 24 projects downward.

Although the process after above is not shown, the foregoing control gate electrode film 24, block insulating film 23 and charge storage insulating film 22 are etched by RIE using a photo resist pattern extending to the word line direction as a mask. In this way, a pattern of the control gate electrode 24 is formed. An impurity element ion is further implanted into the element region to form a source region and a drain region. In the manner described above, a nonvolatile memory cell shown in FIG. 37 is obtained.

According to this embodiment, the lower surface of the control gate electrode 24 projects at a portion corresponding to the center portion of the unit gate structure 25, as viewed from a direction parallel to the channel length direction. Thus, the same effect as the first embodiment is obtained. Therefore, it is possible to obtain a semiconductor device, which is excellent in characteristics and reliability.

Figure 45:
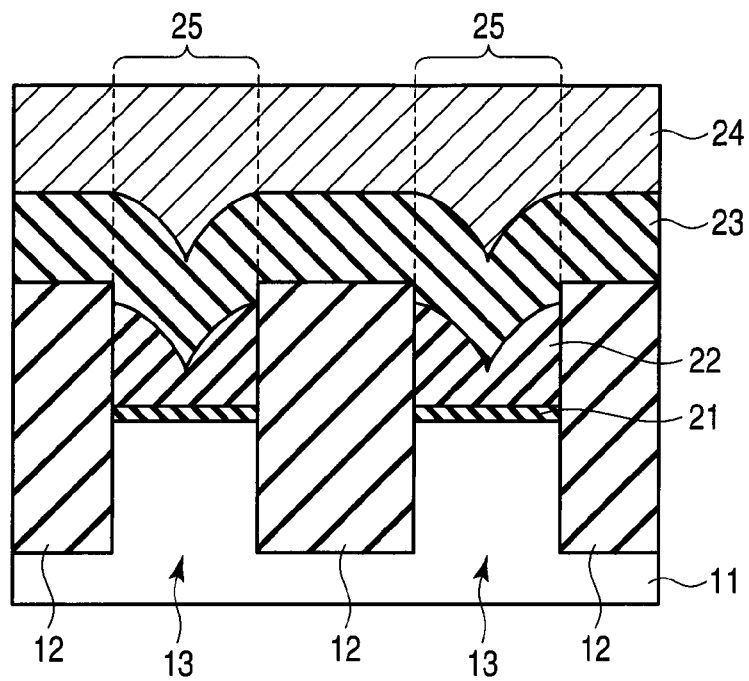
FIG. 45 is a cross-sectional view schematically showing the structure of a semiconductor device according to a modification example of the sixth embodiment of the present invention.

FIG. 45 is a cross sectional view (taken along a channel width direction (word line direction)) schematically showing the structure of a semiconductor device according to a modification example of this embodiment.

According to the modification example, a charge storage insulating film 22 is isolated by an isolation region 12. Thus, this serves to prevent diffusion of charges stored in the charge storage insulating film 22. In other words, it is possible to prevent charge diffusion between memory cells adjacent to each other in the word line direction. Therefore, deterioration of charge retention characteristic due to charge diffusion is prevented; as a result, it is possible to obtain a semiconductor device, which is excellent in characteristics and reliability.

Embodiment 7

Figure 46:
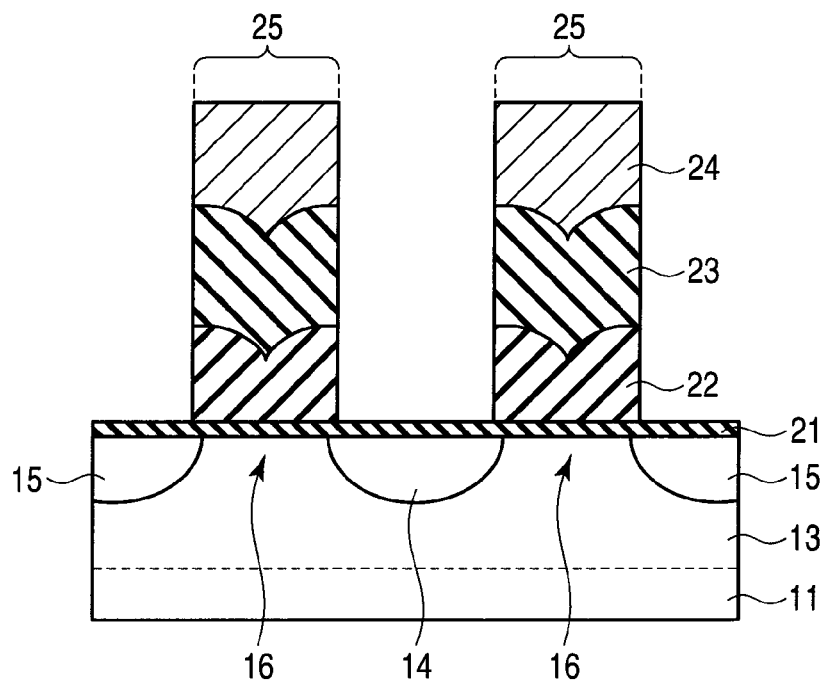
FIG. 46 is a cross-sectional view schematically showing the structure of a semiconductor device according to a seventh embodiment of the present invention.

FIG. 46 is a cross-sectional view taken along a channel length direction (bit line direction) schematically showing the structure of a semiconductor device according to a seventh embodiment of the present invention. The structure of the seventh embodiment is basically the same as the first and second embodiments; therefore, the explanation about the matters described in the first and second embodiments is omitted.

As shown in FIG. 46, a distance between an element region 13 and a control gate electrode 24 is shorter at the center portion of a unit gate structure 25 than at both ends thereof, as viewed from a direction parallel to a channel width direction. In other words, the distance between the element region 13 and the control gate electrode 24 is shorter at the center portion of the unit gate structure 25 than at both ends thereof, as viewed in a section parallel to a channel length direction. For example, the lower surface of the control gate electrode 24 projects at a portion corresponding to the center portion of the unit gate structure 25. In addition, the lower surface of a block insulating film 23 projects at a portion corresponding to the center portion of the unit gate structure 25.

The following is an explanation about a process of manufacturing a semiconductor device according to this embodiment. FIGS. 47 to 51 are cross-sectional views (taken along channel length direction (bit line direction) schematically showing a process of manufacturing a semiconductor device according to this embodiment.

As shown in FIG. 47, a silicon oxide film having a thickness of about 3 nm is first formed as a tunnel insulating film 21 on a semiconductor substrate (silicon substrate) 11 using thermal oxidization. Then, silicon nitride film having a thickness of about 5 nm is formed as a mask film 45 on the tunnel insulating film 21 using a CVD process.

As illustrated in FIG. 48, the foregoing mask film 45 is etched by RIE using a photo resist pattern (not shown) extending to a word line direction as a mask. The photo resist pattern is removed, and thereafter, a silicon oxide film having a thickness of about 5 nm is formed as a sidewall film 46 on the entire surface including the sidewall of the mask film 45 using a CVD process.

As depicted in FIG. 49, the sidewall film 46 is etched by anisotropic etching such as RIE. As a result, the upper surface of the mask film 45 is exposed, and the sidewall film 46 remains on the sidewall of the mask film 45. The exposed mask film 45 is further selectively removed using a chemical solution. In this way, a trench 47 held between the sidewall films 46 is formed.

Figure 50:
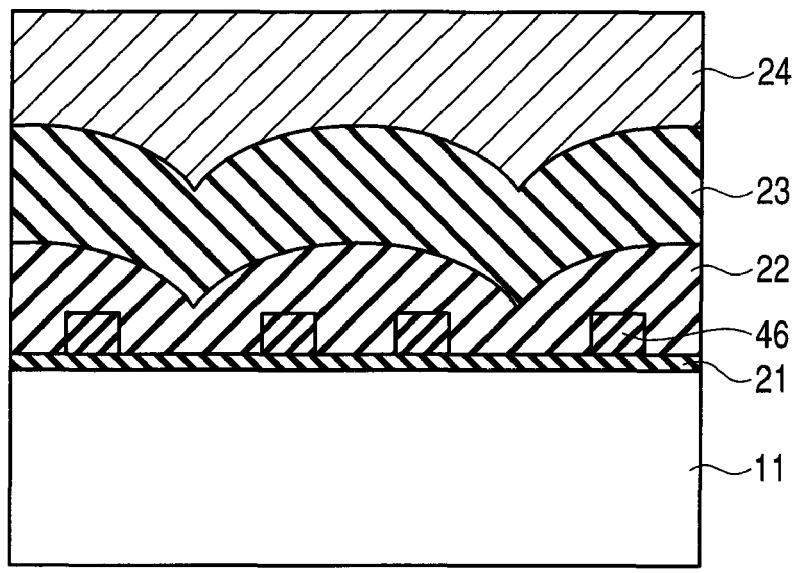

As seen from FIG. 50, a charge storage insulating film 22 is formed on the entire surface to cover the sidewall film 46. For example, a silicon nitride film having a thickness of about 5 nm is formed as the charge storage insulating film 22 using a CVD process. A block insulating film 23 is further formed on the charge storage insulating film 22. For example, an alumina film having a thickness of about 30 nm is formed as the block insulating film 23 via an ALD process. Then, a control gate electrode film 24 having a thickness of about 100 nm is formed on the block insulating film 23. For example, a stacked film of polysilicon and tungsten silicide is formed as the control gate electrode film 24 using a CVD process. In this case, the upper surface of the tunnel insulating film 21 is situated at a position lower than the upper surface of the sidewall film 46. Therefore, each lower surface of the block insulating film 23 and the control gate electrode 24 projects downward.

Figure 51:
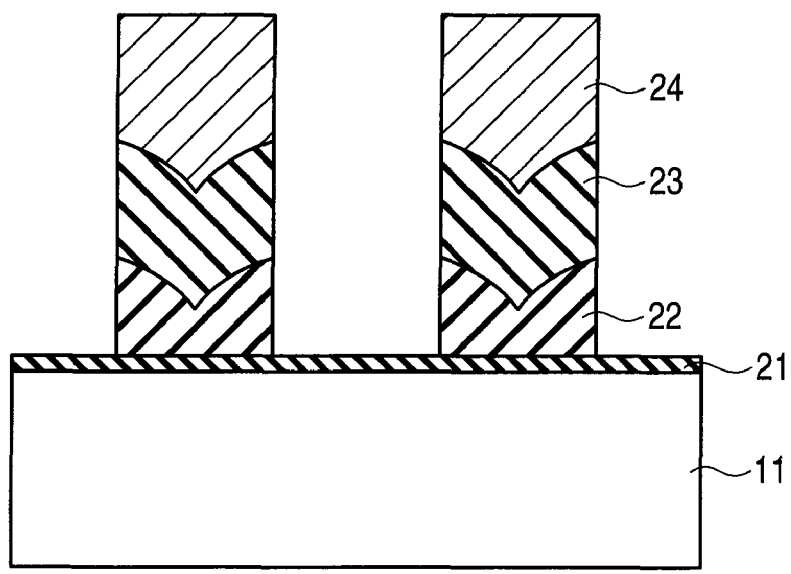

As shown in FIG. 51, the foregoing control gate electrode film 24, block insulating film 23, and the like, are etched via RIE using a photo resist pattern (not shown) extending to the word line direction as a mask. In this way, a pattern of the control gate electrode 24 is formed.

Although the process after above is not shown, an impurity element ion is implanted to the element region to form a source region and a drain region. In the manner described above, a nonvolatile memory cell shown in FIG. 46 is obtained.

According to this embodiment, the lower surface of the control gate electrode 24 projects at a portion corresponding to the center portion of the unit gate structure 25, as viewed from a direction parallel to the channel width direction, like the second embodiment. Thus, the same effect as the second embodiment is obtained. Therefore, it is possible to obtain a semiconductor device, which is excellent in characteristics and reliability.

According to the foregoing embodiments, a silicon oxide film is used as the isolation region (isolation insulating film) 13. A silicon oxide film is used as the tunnel insulating film 21. A silicon nitride film is used as the charge storage insulating film 22. Alumina is used as the block insulating film 23. In this case, other insulating film may be used. For example, metal oxide films such as a hafnium oxide film and a zirconium oxide film may be used. The foregoing films are used, and thereby, process damage is increased at the end portion of the unit gate structure 25. Therefore, the structure of the foregoing each embodiment is more effective.

Figure 53A:
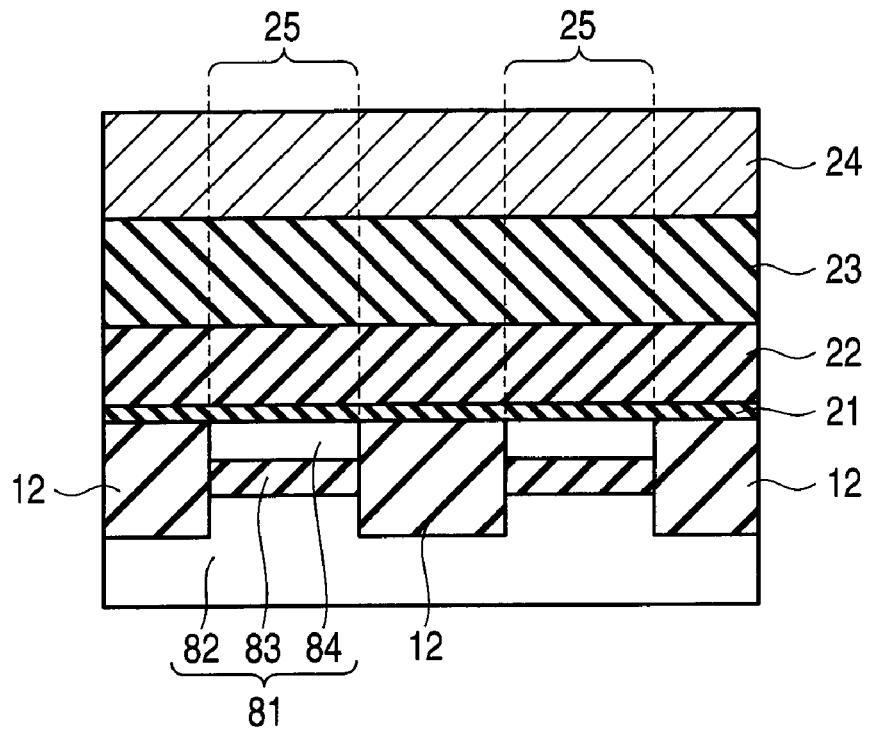
FIGS. 53A and 53B are cross-sectional views schematically showing the structure of a semiconductor device using an SOI substrate according to an embodiment of the present invention.
Figure 53B:
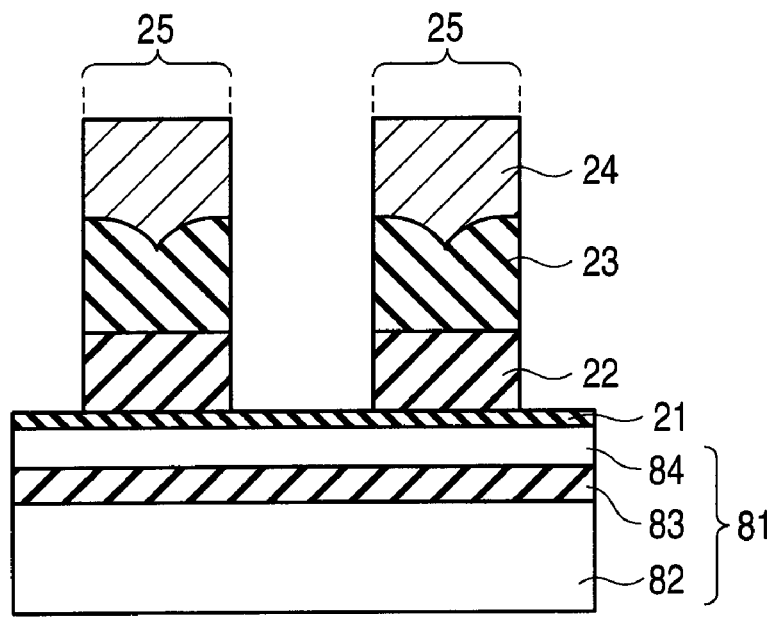

According to the foregoing embodiments, a normal silicon substrate is used as the semiconductor substrate. In this case, an SOI substrate may be used as the semiconductor substrate. FIGS. 52A and 52B show the case where the structure shown in the first embodiment is formed using an SOI substrate. FIGS. 53A and 53B show the case where the structure shown in the second embodiment is formed using an SOI substrate. According to the foregoing two cases, an SOI substrate (semiconductor substrate) 81 is formed of a silicon substrate 82, an insulating layer 83 and a silicon layer 84. The same structure as FIGS. 1A and 1B or FIGS. 11A and 11B is formed on the silicon layer 84. Although illustration is not specially given, the structures shown in the third to seventh embodiments may be formed using an SOI substrate. If the SOI substrate is used, a depletion type memory cell transistor may be formed. In this case, there may be no need to form an impurity diffusion layer for forming source and drain in the silicon layer 84. Even if the SOI substrate is used, the same effect as the foregoing embodiments is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an element region having a channel region;
    a unit gate structure inducing a channel in the channel region, the unit gate structure including: a tunnel insulating film formed on the element region; a charge storage insulating film formed on the tunnel insulating film; a block insulating film formed on the charge storage insulating film; and a control gate electrode formed on the block insulating film; and
    an isolation region sandwiching the element region, the tunnel insulating film, and the charge storage insulating film,
    wherein the block insulating film and the control gate electrode are formed to extend above the element region and on the isolation region,
    a distance between the element region and the control gate electrode is shorter at a center portion of the unit gate structure than at both ends thereof, as viewed in a section parallel to a channel width direction, and
    the charge storage insulating film is entirely sandwiched by the isolation region, and an upper surface of the charge storage insulating film is entirely situated at a position lower than an upper surface of the isolation region.

2. The device according to claim 1, wherein a lower surface of the control gate electrode projects at a portion corresponding to the center portion of the unit gate structure, as viewed in the section parallel to the channel width direction.

3. The device according to claim 2, wherein a tip end of the projected portion is sharp.

4. The device according to claim 2, wherein a tip end of the projected portion is flattened.

5. The device according to claim 2, wherein a tip end of the projected portion is rounded.

6. The device according to claim 2, wherein a lower surface of the block insulating film projects at a portion corresponding to the center portion of the unit gate structure, as viewed in the section parallel to the channel width direction.

7. The device according to claim 1, wherein the isolation region further sandwiches the block insulating film.

8. The device according to claim 1, wherein an upper surface of the element region projects at a portion corresponding to the center portion of the unit gate structure, as viewed in the section parallel to the channel width direction.

9. The device according to claim 1, wherein a distance between the element region and the control gate electrode is shorter at a center portion of the unit gate structure than at both ends thereof, as viewed in a section parallel to a channel length direction.

* * * * *